US008893111B2

(12) United States Patent
Cohen et al.

(10) Patent No.: US 8,893,111 B2
(45) Date of Patent: *Nov. 18, 2014

(54) EVENT EVALUATION USING EXTRINSIC STATE INFORMATION

(75) Inventors: Alexander J. Cohen, Mill Valley, CA (US); Edward K. Y. Jung, Bellevue, WA (US); Royce A. Levien, Lexington, MA (US); Robert W. Lord, Seattle, WA (US); Mark A. Malamud, Seattle, WA (US); John D. Rinaldo, Jr., Bellevue, WA (US); Lowell L. Wood, Jr., Livermore, CA (US)

(73) Assignee: The Invention Science Fund I, LLC, Bellevue, WA (US)

( * ) Notice: Subject to any disclaimer, the term of this patent is extended or adjusted under 35 U.S.C. 154(b) by 1251 days.

This patent is subject to a terminal disclaimer.

(21) Appl. No.: 11/396,412

(22) Filed: Mar. 31, 2006

(65) Prior Publication Data

US 2007/0234270 A1    Oct. 4, 2007

Related U.S. Application Data

(63) Continuation-in-part of application No. 11/396,409, filed on Mar. 31, 2006, and a continuation-in-part of application No. 11/396,396, filed on Mar. 31, 2006.

(51) Int. Cl.
*G06F 9/44* (2006.01)

(52) U.S. Cl.
USPC ...................................................... 717/172

(58) Field of Classification Search
USPC .......... 717/168–178; 709/200, 245, 223–224, 709/221, 227; 455/7; 370/244; 714/27; 710/36; 707/100; 713/201, 191
See application file for complete search history.

(56) References Cited

U.S. PATENT DOCUMENTS

| | | | |
|---|---|---|---|
| 5,511,197 A | 4/1996 | Hill et al. | |
| 5,689,703 A | 11/1997 | Atkinson et al. | |
| 5,699,518 A | 12/1997 | Held et al. | |
| 5,710,925 A | 1/1998 | Leach et al. | |
| 5,721,919 A | 2/1998 | Morel et al. | |
| 5,724,588 A | 3/1998 | Hill et al. | |
| 5,740,439 A | 4/1998 | Atkinson et al. | |
| 5,802,367 A | 9/1998 | Held et al. | |
| 5,835,911 A | 11/1998 | Nakagawa et al. | |
| 5,842,018 A | 11/1998 | Atkinson et al. | |
| 5,999,986 A | 12/1999 | McCauley, III et al. | |
| 6,065,046 A | 5/2000 | Feinberg et al. | |
| 6,098,091 A | 8/2000 | Kisor | |
| 6,151,643 A * | 11/2000 | Cheng et al. | 710/36 |
| 6,230,212 B1 | 5/2001 | Morel et al. | |
| 6,263,379 B1 | 7/2001 | Atkinson et al. | |
| 6,330,554 B1 | 12/2001 | Altschuler et al. | |
| 6,385,661 B1 | 5/2002 | Guthrie et al. | |

(Continued)

OTHER PUBLICATIONS

PCT International Search Report; International App. No. PCT/US07/07175, Sep. 24, 2008, pp. 1-2.

(Continued)

*Primary Examiner* — Tuan A Vu

(57) ABSTRACT

A method and system are described for obtaining an indication of an event in a first subsystem roughly contemporaneously with obtaining information pertinent to a state of a second subsystem and transmitting an evaluation of the event in the first subsystem, responsive to the information pertinent to the state of the second subsystem.

38 Claims, 21 Drawing Sheets

(56) References Cited

U.S. PATENT DOCUMENTS

| | | | |
|---|---|---|---|
| 6,389,452 B1 | 5/2002 | Glass | |
| 6,412,020 B1 | 6/2002 | Leach et al. | |
| 6,415,315 B1 | 7/2002 | Glass | |
| 6,442,586 B1 | 8/2002 | Glass | |
| 6,513,157 B1 | 1/2003 | Glass | |
| 6,519,653 B1 | 2/2003 | Glass | |
| 6,519,764 B1 | 2/2003 | Atkinson et al. | |
| 6,535,928 B1 | 3/2003 | Glass | |
| 6,539,374 B2 | 3/2003 | Jung | |
| 6,539,390 B1 | 3/2003 | Kiczales et al. | |
| 6,549,955 B2 | 4/2003 | Guthrie et al. | |
| 6,557,046 B1 | 4/2003 | McCauley, III et al. | |
| 6,606,613 B1 | 8/2003 | Altschuler et al. | |
| 6,622,175 B1 | 9/2003 | Piller | |
| 6,629,128 B1 | 9/2003 | Glass | |
| 6,678,743 B1 | 1/2004 | Glass et al. | |
| 6,754,885 B1 | 6/2004 | Dardinski et al. | |
| 6,760,903 B1 | 7/2004 | Morshed et al. | |
| 6,778,971 B1 | 8/2004 | Altschuler et al. | |
| 6,834,389 B1 | 12/2004 | Glass | |
| 6,845,394 B2 | 1/2005 | Ritche | |
| 6,930,785 B1 | 8/2005 | Weyand et al. | |
| 6,931,455 B1 | 8/2005 | Glass | |
| 6,947,965 B2 | 9/2005 | Glass | |
| 6,950,827 B2 | 9/2005 | Jung | |
| 6,951,021 B1 | 9/2005 | Bodwell et al. | |
| 6,961,772 B1 | 11/2005 | Wensel | |
| 6,993,774 B1 | 1/2006 | Glass | |
| 7,031,654 B2* | 4/2006 | Yamaguchi | 455/7 |
| 7,089,530 B1 | 8/2006 | Dardinski et al. | |
| 7,096,465 B1 | 8/2006 | Dardinski et al. | |
| 7,130,923 B2* | 10/2006 | Mason | 709/245 |
| 7,136,903 B1 | 11/2006 | Phillips et al. | |
| 7,140,007 B2 | 11/2006 | Lamping | |
| 7,200,775 B1* | 4/2007 | Rhea et al. | 714/27 |
| 7,225,426 B2 | 5/2007 | Frank et al. | |
| 7,275,237 B1 | 9/2007 | Schneider et al. | |
| 7,284,157 B1 | 10/2007 | McMichael et al. | |
| 7,299,277 B1 | 11/2007 | Moran et al. | |
| 7,308,674 B2 | 12/2007 | Fairweather | |
| 7,398,426 B2 | 7/2008 | Colyer | |
| 7,603,460 B2* | 10/2009 | Adya et al. | 709/224 |
| 7,865,583 B2 | 1/2011 | Cohen et al. | |
| 7,890,952 B2 | 2/2011 | Marion et al. | |
| 7,979,457 B1 | 7/2011 | Garman | |
| 7,996,255 B1 | 8/2011 | Shenoy et al. | |
| 8,090,801 B1 | 1/2012 | Pillai et al. | |
| 8,104,043 B2 | 1/2012 | Padisetty et al. | |
| 8,171,474 B2 | 5/2012 | Mankovski | |
| 2002/0013831 A1 | 1/2002 | Astala et al. | |
| 2002/0095454 A1 | 7/2002 | Reed et al. | |
| 2002/0129126 A1 | 9/2002 | Chu et al. | |
| 2003/0018694 A1 | 1/2003 | Chen et al. | |
| 2003/0026254 A1 | 2/2003 | Sim | |
| 2003/0046396 A1 | 3/2003 | Richter et al. | |
| 2003/0055994 A1 | 3/2003 | Herrmann et al. | |
| 2003/0071899 A1 | 4/2003 | Joao | |
| 2003/0088573 A1 | 5/2003 | Stickler | |
| 2003/0088593 A1 | 5/2003 | Stickler | |
| 2003/0093434 A1 | 5/2003 | Stickler | |
| 2003/0097365 A1 | 5/2003 | Stickler | |
| 2003/0105746 A1 | 6/2003 | Stickler | |
| 2003/0115254 A1 | 6/2003 | Suzuki | |
| 2003/0115262 A1 | 6/2003 | Dai | |
| 2003/0126031 A1 | 7/2003 | Asami | |
| 2003/0144894 A1 | 7/2003 | Robertson et al. | |
| 2003/0171939 A1 | 9/2003 | Yagesh et al. | |
| 2003/0193404 A1 | 10/2003 | Joao | |
| 2003/0193994 A1 | 10/2003 | Stickler | |
| 2003/0208568 A1 | 11/2003 | Inoue et al. | |
| 2003/0229528 A1 | 12/2003 | Nitao et al. | |
| 2003/0229900 A1 | 12/2003 | Reisman | |
| 2004/0003266 A1* | 1/2004 | Moshir et al. | 713/191 |
| 2004/0037423 A1 | 2/2004 | Ghanea-Hercock | |
| 2004/0044542 A1 | 3/2004 | Beniaminy et al. | |
| 2004/0044999 A1 | 3/2004 | Gibson | |
| 2004/0067754 A1 | 4/2004 | Gao et al. | |
| 2004/0071090 A1* | 4/2004 | Corson et al. | 370/244 |
| 2004/0073904 A1 | 4/2004 | Hill | |
| 2004/0083373 A1 | 4/2004 | Perkins et al. | |
| 2004/0088347 A1 | 5/2004 | Yeager et al. | |
| 2004/0088348 A1 | 5/2004 | Yeager et al. | |
| 2004/0088646 A1 | 5/2004 | Yeager et al. | |
| 2004/0111619 A1 | 6/2004 | Laurie et al. | |
| 2004/0123153 A1* | 6/2004 | Wright et al. | 713/201 |
| 2004/0133640 A1 | 7/2004 | Yeager et al. | |
| 2004/0151162 A1 | 8/2004 | Ramaswamy | |
| 2004/0162638 A1 | 8/2004 | Solomon | |
| 2004/0162890 A1 | 8/2004 | Ohta | |
| 2004/0181790 A1 | 9/2004 | Herrick | |
| 2004/0196810 A1 | 10/2004 | Kil et al. | |
| 2004/0198386 A1* | 10/2004 | Dupray | 455/456.1 |
| 2004/0205772 A1 | 10/2004 | Uszok et al. | |
| 2004/0210653 A1 | 10/2004 | Kanoor et al. | |
| 2004/0246911 A1 | 12/2004 | Bonsma et al. | |
| 2004/0249914 A1 | 12/2004 | Flocken et al. | |
| 2004/0255291 A1 | 12/2004 | Sierer et al. | |
| 2004/0259545 A1 | 12/2004 | Morita | |
| 2004/0260928 A1 | 12/2004 | Immonen | |
| 2004/0267916 A1 | 12/2004 | Chambliss et al. | |
| 2005/0004978 A1 | 1/2005 | Reed et al. | |
| 2005/0005200 A1 | 1/2005 | Matena et al. | |
| 2005/0120106 A1 | 6/2005 | Albertao | |
| 2005/0125525 A1 | 6/2005 | Zhou et al. | |
| 2005/0125683 A1 | 6/2005 | Matsuyama et al. | |
| 2005/0132349 A1 | 6/2005 | Roberts et al. | |
| 2005/0154701 A1 | 7/2005 | Parunak et al. | |
| 2005/0213545 A1 | 9/2005 | Choyi et al. | |
| 2005/0228990 A1 | 10/2005 | Kato et al. | |
| 2005/0246434 A1 | 11/2005 | Bantz et al. | |
| 2006/0015512 A1* | 1/2006 | Alon et al. | 707/100 |
| 2006/0047721 A1 | 3/2006 | Narang et al. | |
| 2006/0048020 A1 | 3/2006 | Newport et al. | |
| 2006/0058847 A1 | 3/2006 | Lenz et al. | |
| 2006/0059253 A1* | 3/2006 | Goodman et al. | 709/223 |
| 2006/0059486 A1 | 3/2006 | Loh et al. | |
| 2006/0064486 A1 | 3/2006 | Baron et al. | |
| 2006/0112176 A1 | 5/2006 | Liu et al. | |
| 2006/0168574 A1* | 7/2006 | Giannini et al. | 717/168 |
| 2007/0033586 A1 | 2/2007 | Hirsave et al. | |
| 2007/0100834 A1 | 5/2007 | Landry et al. | |
| 2007/0162485 A1 | 7/2007 | Haeberle et al. | |

OTHER PUBLICATIONS

U.S. Appl. No. 11/396,409, Cohen et al.
U.S. Appl. No. 11/396,396, Cohen et al.
Bradshaw, Jeffrey M.; Dutfield, Stewart; Carpenter, Bob; Jeffers, Renia; Robinson, Tom; "KAoS: A Generic Agent Architecture for Aerospace Applications"; Total pp. 1-22.
"Palm and PrePalm Research Quickstart Guide"; Bearing a date of 2001; Total pp. 1-278; Version 2, Release 2, Modification 0; Cerfacs; located at: http://www.cerfacs.fr/globc/PALM_WEB/doc/external/QIKGUIDE/qikguide.html.
Jansen, Wayne et al.; "Mobile Agent Security"; National Institute of Standards and Technology Special Publication 800-19; dated Aug. 1999; pp. 1-38 +3 pages of index.
Kiezales, Gregor et al.; "Aspect-Oriented Programming"; European Conference on Object-Oriented Programming (ECOOP); dated Jun. 1997; pp. 1-24.
PCT International Search Report; International App. No. PCT/US 07/07165; Jul. 23, 2008; pp. 1-3.
Xu, Dianxiang et al.; "An Aspect-Oriented Approach to Mobile Agent Access Control"; International Conference on Information and Technology—Coding and Computing; dated Apr. 4-6, 2005; pp. 668-673; vol. 1.
"Aspect-Oriented Programming"; Communications of the ACM; bearing a date of Oct. 2001; 67 pages total; vol. 44, No. 10; Association for Computing Machinery, Inc.
Constaninides, Constantinos A. et al.; "Designing an Aspect-Oriented Framework in an Object-Oriented Environment"; ACM; Bearing a date of 2000; pp. 1-16; vol. 32, Issue 1es; ACM Press.

(56) References Cited

OTHER PUBLICATIONS

Control Shell Users Manual, Version 5.1; bearing a date of Jun. 1996; 348 pages (whole manual); Real Time Innovations Inc.

Control Shell Users Manual, Version 6.0; bearing date of Jan. 1999; 379 pages (whole manual); Real-Time Innovations Inc.

Hilsdale, Erik et al.; "AspectJ™: the Language and Support Tools"; Association for Computing Machinery; bearing a date of 2000; 3 pages total; ACM Press.

Lieberherr, Karl J.; "Early Definition of Aspect Oriented Programming"; print date Nov. 28, 2001; 5 pages total; located at: http://www.ccs.neu.edu/research/demeter/AOP/early-def/AP-AOP.html and http://www.ccs.neu.edu/research/demeter/AOP/what-is-an-aspect.txt.

O'Brien, Larry; "The First Aspect-Oriented Compiler"; Software Development Online; bearing a date of Sep. 2001; 7 pages; Located at: http://www.sdmagazine.com/printldocumentID=16030.

Price, Rich; "Product Review—AspectJ, 0.8b5: Real-world AOP tool simplifies OO development"; JAVA Report; print date Nov. 28, 2001; pp. 1-5; located at http://www.javareport.com/html/from...s/article.asp?id=4712&mon=9&yr=2001.

Taylor, David A.; "Object-Oriented Information Systems: Planning and Implementation"; Wiley Professional Computing; bearing a date of Apr. 10, 1992; pp. 1-357 (371 total pages); John Wiley & Sons, Inc.

"Thoughts on Aspect Oriented Programming"; print date Nov. 28, 2001; pp. 1-3; located at http://openmap.bbn.com/~kanderso/aop/AOP-thoughts.htm.

Viega, John et al.; "Can Aspect-Oriented Programming Lead to More Reliable Software?"; IEEE; Bearing a date of Nov./Dec. 2000; pp. 19-21; IEEE Software.

Voelter, Markus; "Aspect-Oriented Programming in Java"; print date Nov. 28, 2001; pp. 1-7; located at http://www.voelter.de/data/articles/aop/aop.htm.

Walker, Robert J. et al.; "An initial assessment of aspect-oriented programming"; International Conference on Software Engineering; bearing a date of May 16-22, 1999; 1 page [abstract]; ACM Digital Library.

Chen et al.; "Mobile-C: A Mobile Agent Platform for Mobile C/C++ Agents"; Software—Practice and Experience; Jul. 25, 2005; pp. 1711-1733; vol. 36; John Wiley & Sons Ltd.

Lee, Dong Chun; "Efficient Migration Scheme Using Backward Recovery Algorithm for Mobile Agents in WLAN"; Knowledge Based Intelligent Information and Engineering Systems; Aug. 2005; pp. 101-106; Springer Berlin/Heidelberg.

Wang et al.; "A Mobile Agent Architecture for Heterogeneous Devices"; $3^{rd}$ IASTED International Conference on Wireless and Optical Communications (WOC'2003); Jul. 2003; pp. 584-590; Banff, Canada.

\* cited by examiner

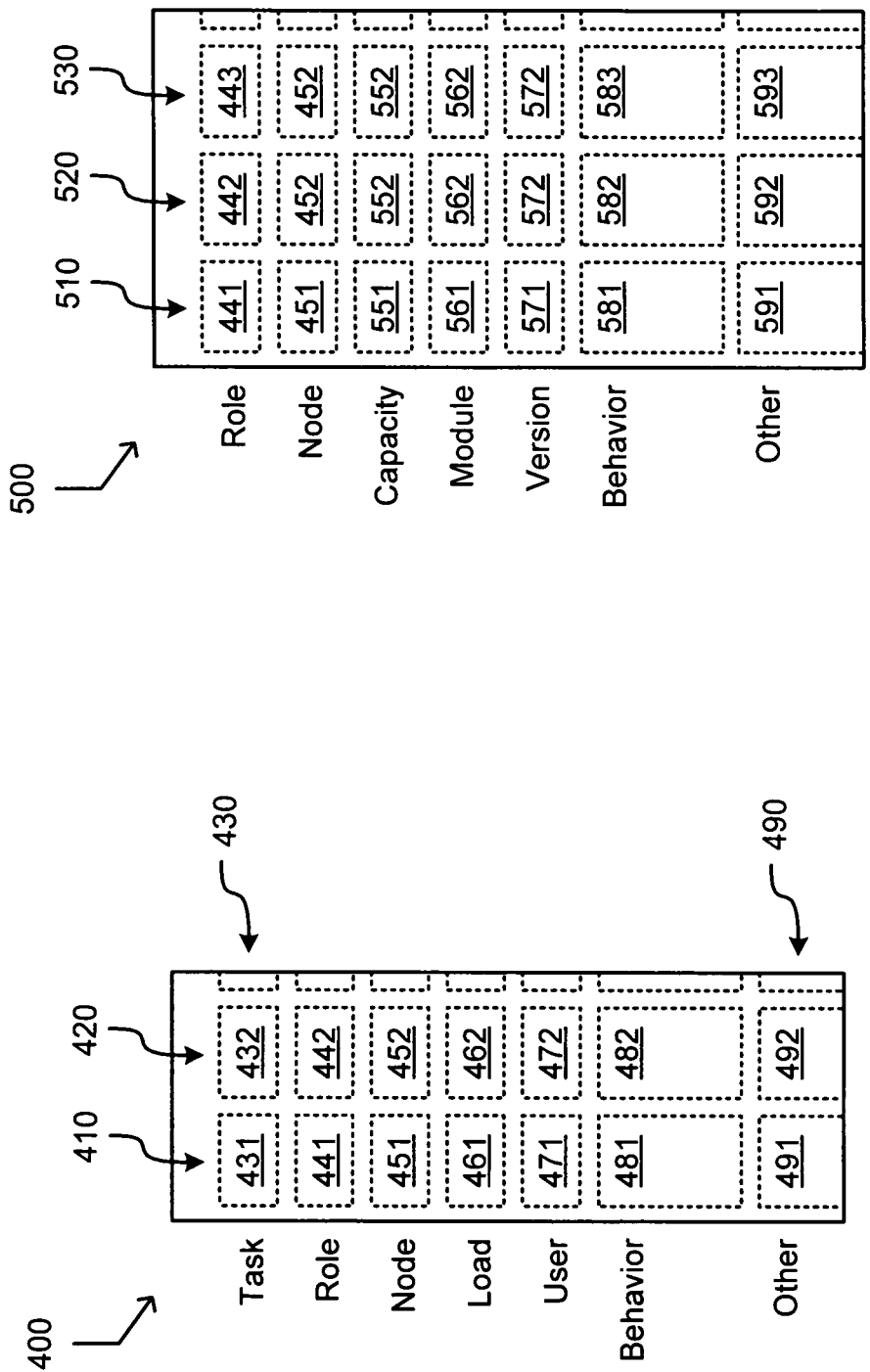

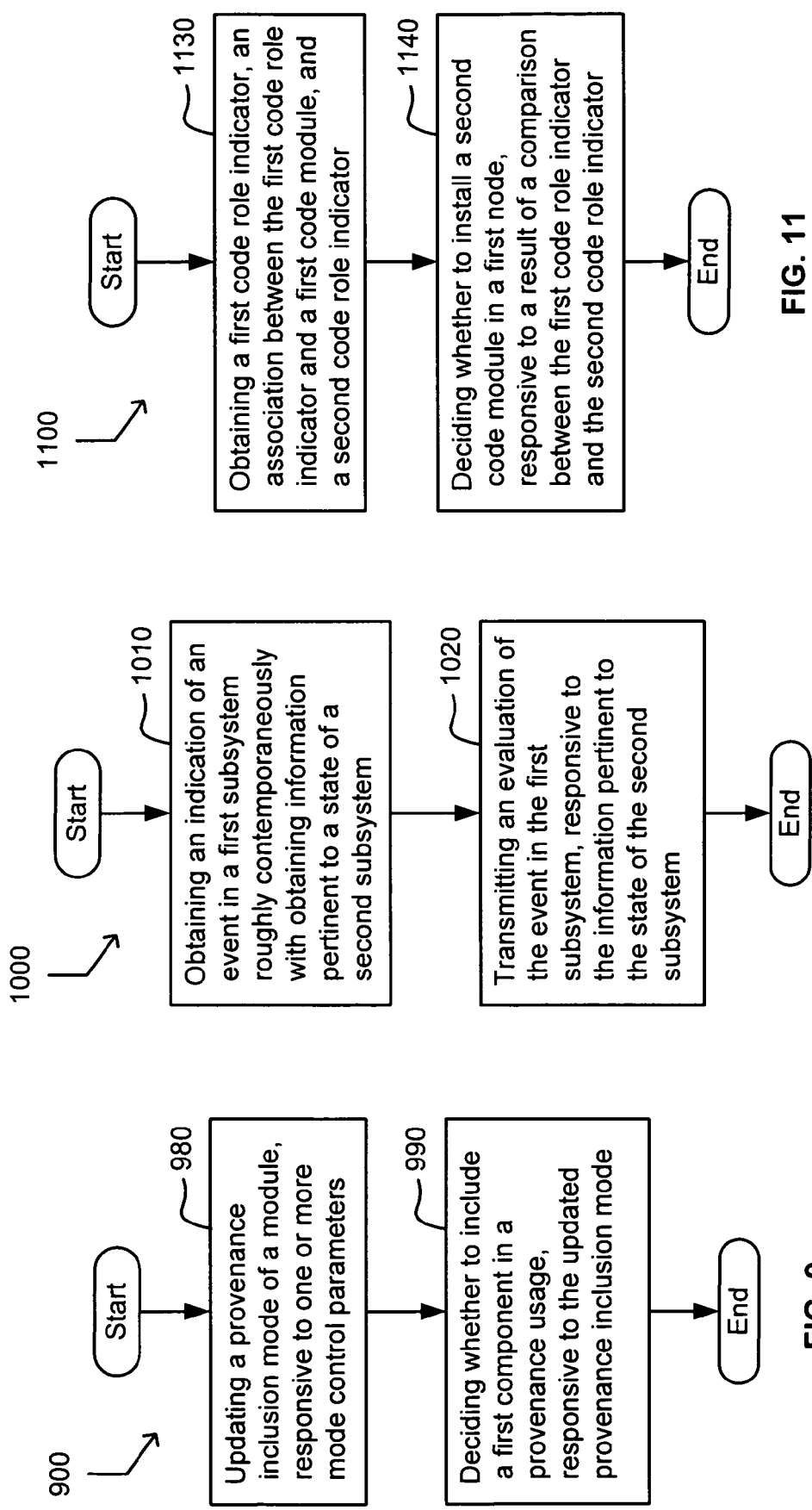

EVENT EVALUATION USING EXTRINSIC STATE INFORMATION

CROSS-REFERENCE TO RELATED APPLICATIONS

The present application is related to and claims the benefit of the earliest available effective filing date(s) from the following listed application(s) (the "Related Applications") (e.g., claims earliest available priority dates for other than provisional patent applications or claims benefits under 35 USC §119(e) for provisional patent applications, for any and all parent, grandparent, great-grandparent, etc. applications of the Related Application(s)).

RELATED APPLICATIONS

For purposes of the USPTO extra-statutory requirements, the present Application constitutes a continuation-in-part of U.S. patent application Ser. No. 11/396/409, entitled AGGREGATING NETWORK ACTIVITY USING SOFTWARE PROVENANCE DATA, filed Mar. 31, 2006 naming Alexander J. Cohen; Edward K. Y. Jung; Royce A. Levien; Robert W. Lord; Mark A. Malamud; John D. Rinaldo, Jr. and Lowell L. Wood, Jr. as inventors, filed contemporaneously herewith, which is currently co-pending, or is an application of which a currently co-pending application is entitled to the benefit of the filing date.

For purposes of the USPTO extra-statutory requirements, the present Application constitutes a continuation-in-part of U.S. patent application Ser No. 11/396,396, entitled CODE INSTALLATION DECISIONS FOR IMPROVING AGGREGATE FUNCTIONALITY, filed Mar. 31, 2006 naming Alexander J. Cohen; Edward K. Y. Jung; Royce A. Levien; Robert W. Lord; Mark A. Malamud; John D. Rinaldo, Jr. and Lowell L. Wood, Jr. as inventors, filed contemporaneously herewith, which is currently co-pending, or is an application of which a currently co-pending application is entitled to the benefit of the filing date.

The United States Patent Office (USPTO) has published a notice to the effect that the USPTO's computer programs require that patent applicants reference both a serial number and indicate whether an application is a continuation or continuation-in-part. Stephen G. Kunin, *Benefit of Prior-Filed Application*, USPTO Official Gazette Mar. 18, 2003, available at http://www.uspto.gov/web/offices/com/sol/og/2003/week11/patbene.htm. The present applicant entity has provided above a specific reference to the application(s) from which priority is being claimed as recited by statute. Applicant entity understands that the statute is unambiguous in its specific reference language and does not require either a serial number or any characterization, such as "continuation" or "continuation-in-part," for claiming priority to U.S. patent applications. Notwithstanding the foregoing, applicant entity understands that the USPTO's computer programs have certain data entry requirements, and hence applicant entity is designating the present application as a continuation-in-part of its parent applications as set forth above, but expressly points out that such designations are not to be construed in any way as any type of commentary and/or admission as to whether or not the present application contains any new matter in addition to the matter of its parent application(s).

All subject matter of the Related Applications and of any and all parent, grandparent, great-grandparent, etc. applications of the Related Applications is incorporated herein by reference to the extent such subject matter is not inconsistent herewith.

SUMMARY

An embodiment provides a method. In one implementation, the method includes but is not limited to receiving, at a first node, provenance data including at least a handle relating to a first software program active on a second node and executing one or more instructions received from the second node, on the first node. In addition to the foregoing, other method aspects are described in the claims, drawings, and text forming a part of the present disclosure.

In one or more various aspects, related systems include but are not limited to circuitry and/or programming for effecting the herein-referenced method aspects; the circuitry and/or programming can be virtually any combination of hardware, software, and/or firmware configured to effect the herein-referenced method aspects depending upon the design choices of the system designer.

An embodiment provides a system. In one implementation, the system includes but is not limited to circuitry for receiving, at a first node, provenance data including at least a handle relating to a first software program active on a second node and circuitry for executing one or more instructions received from the second node, on the first node. In addition to the foregoing, other system aspects are described in the claims, drawings, and text forming a part of the present disclosure.

An embodiment provides a method. In one implementation, the method includes but is not limited to obtaining an association at least between a first registry state and an event indication from a first device; obtaining an association at least between a second registry state and a failure indication from a second device; and transmitting a message partly based on the first registry state and partly based on the second registry state. In addition to the foregoing, other method aspects are described in the claims, drawings, and text forming a part of the present disclosure.

In one or more various aspects, related systems include but are not limited to circuitry and/or programming for effecting the herein-referenced method aspects; the circuitry and/or programming can be virtually any combination of hardware, software, and/or firmware configured to effect the herein-referenced method aspects depending upon the design choices of the system designer.

An embodiment provides a system. In one implementation, the system includes but is not limited to circuitry for obtaining an association at least between a first registry state and an event indication from a first device; circuitry for obtaining an association at least between a second registry state and a failure indication from a second device; and circuitry for transmitting a message partly based on the first registry state and partly based on the second registry state. In addition to the foregoing, other system aspects are described in the claims, drawings, and text forming a part of the present disclosure.

An embodiment provides a method. In one implementation, the method includes but is not limited to obtaining a resource status indication relating to a first node, in the first node; obtaining a resource status indication relating to a second node, in the first node; and transmitting a provenance component, responsive to the obtained resource status indication relating to the first node and to the obtained resource status indication relating to the second node. In addition to the foregoing, other method aspects are described in the claims, drawings, and text forming a part of the present disclosure.

In one or more various aspects, related systems include but are not limited to circuitry and/or programming for effecting the herein-referenced method aspects; the circuitry and/or programming can be virtually any combination of hardware, software, and/or firmware configured to effect the herein-referenced method aspects depending upon the design choices of the system designer.

An embodiment provides a system. In one implementation, the system includes but is not limited to circuitry for obtaining a resource status indication relating to a first node, in the first node; circuitry for obtaining a resource status indication relating to a second node, in the first node; and circuitry for transmitting a provenance component, responsive to the obtained resource status indication relating to the first node and to the obtained resource status indication relating to the second node. In addition to the foregoing, other system aspects are described in the claims, drawings, and text forming a part of the present disclosure.

An embodiment provides a method. In one implementation, the method includes but is not limited to updating a provenance inclusion mode of a module, responsive to one or more mode control parameters; and deciding whether to include a first component in a provenance usage, responsive to the updated provenance inclusion mode. In addition to the foregoing, other method aspects are described in the claims, drawings, and text forming a part of the present disclosure.

In one or more various aspects, related systems include but are not limited to circuitry and/or programming for effecting the herein-referenced method aspects; the circuitry and/or programming can be virtually any combination of hardware, software, and/or firmware configured to effect the herein-referenced method aspects depending upon the design choices of the system designer.

An embodiment provides a system. In one implementation, the system includes but is not limited to circuitry for updating a provenance inclusion mode of a module, responsive to one or more mode control parameters; and circuitry for deciding whether to include a first component in a provenance usage, responsive to the updated provenance inclusion mode. In addition to the foregoing, other system aspects are described in the claims, drawings, and text forming a part of the present disclosure.

An embodiment provides a method. In one implementation, the method includes but is not limited to obtaining an indication of an event in a first subsystem roughly contemporaneously with obtaining information pertinent to a state of a second subsystem and transmitting an evaluation of the event in the first subsystem, responsive to the information pertinent to the state of the second subsystem. In addition to the foregoing, other method aspects are described in the claims, drawings, and text forming a part of the present disclosure.

In one or more various aspects, related systems include but are not limited to circuitry and/or programming for effecting the herein-referenced method aspects; the circuitry and/or programming can be virtually any combination of hardware, software, and/or firmware configured to effect the herein-referenced method aspects depending upon the design choices of the system designer.

An embodiment provides a system. In one implementation, the system includes but is not limited to circuitry for obtaining an indication of an event in a first subsystem roughly contemporaneously with obtaining information pertinent to a state of a second subsystem and circuitry for transmitting an evaluation of the event in the first subsystem, responsive to the information pertinent to the state of the second subsystem. In addition to the foregoing, other system aspects are described in the claims, drawings, and text forming a part of the present disclosure.

An embodiment provides a method. In one implementation, the method includes but is not limited to obtaining a first code role indicator, an association between the first code role indicator and a first code module, and a second code role indicator and deciding whether to install a second code module in a first node, responsive to a result of a comparison between the first code role indicator and the second code role indicator. In addition to the foregoing, other method aspects are described in the claims, drawings, and text forming a part of the present disclosure.

In one or more various aspects, related systems include but are not limited to circuitry and/or programming for effecting the herein-referenced method aspects; the circuitry and/or programming can be virtually any combination of hardware, software, and/or firmware configured to effect the herein-referenced method aspects depending upon the design choices of the system designer.

An embodiment provides a system. In one implementation, the system includes but is not limited to circuitry for obtaining a first code role indicator, an association between the first code role indicator and a first code module, and a second code role indicator and circuitry for deciding whether to install a second code module in a first node, responsive to a result of a comparison between the first code role indicator and the second code role indicator. In addition to the foregoing, other system aspects are described in the claims, drawings, and text forming a part of the present disclosure.

In addition to the foregoing, various other embodiments are set forth and described in the text (e.g., claims and/or detailed description) and/or drawings of the present description.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

FIG. 4 depicts information that can be used in one or more of the above environments.

FIG. 5 depicts other information that can be used in one or more of the above environments.

FIG. 9 depicts a high-level logic flow of another operational process.

FIG. 10 depicts a high-level logic flow of another operational process.

FIG. 11 depicts a high-level logic flow of another operational process.

DETAILED DESCRIPTION

Figure 1:
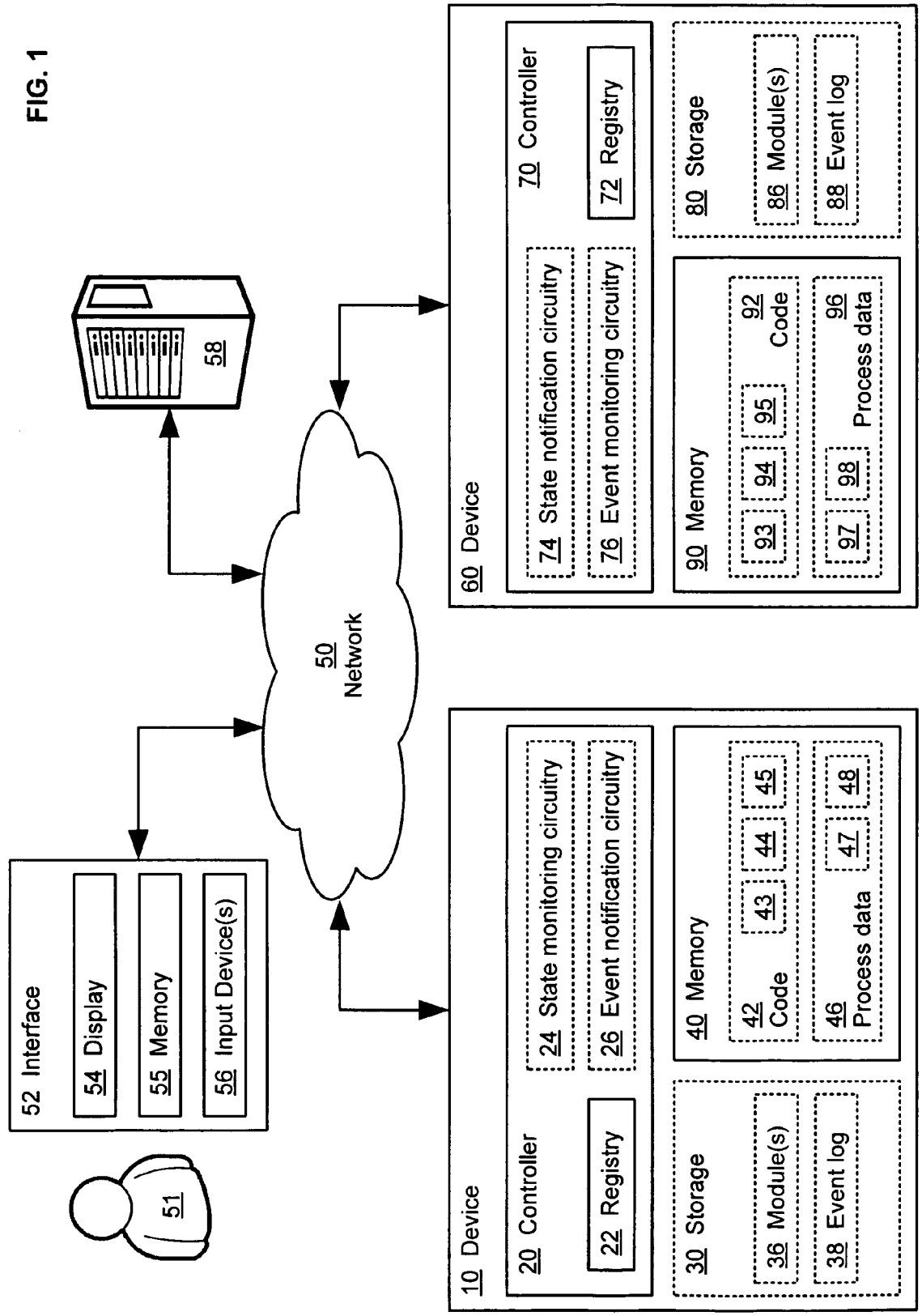
FIG. 1 depicts an exemplary environment in which one or more technologies may be implemented.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

Referring now to FIG. 1, there is shown an exemplary environment in which one or more technologies may be implemented. As shown network 50 is linked to each of device 10, interface 52 (accessible to user 51), server 58, and device 60. Interface 52 includes display 54, memory 55, and input device(s) 56. Device 10 includes controller 20 and memory 40, and can also include storage 30. Controller 20 includes registry 22, and can include state monitoring circuitry 24 or event notification circuitry 26. Storage can include module(s) 36 or event log 38. Memory 40 can include code 42 (which can include one or more of modules 43, 44, 45) or process data 46 (which can include one or more of components 47, 48).

Figure 2:
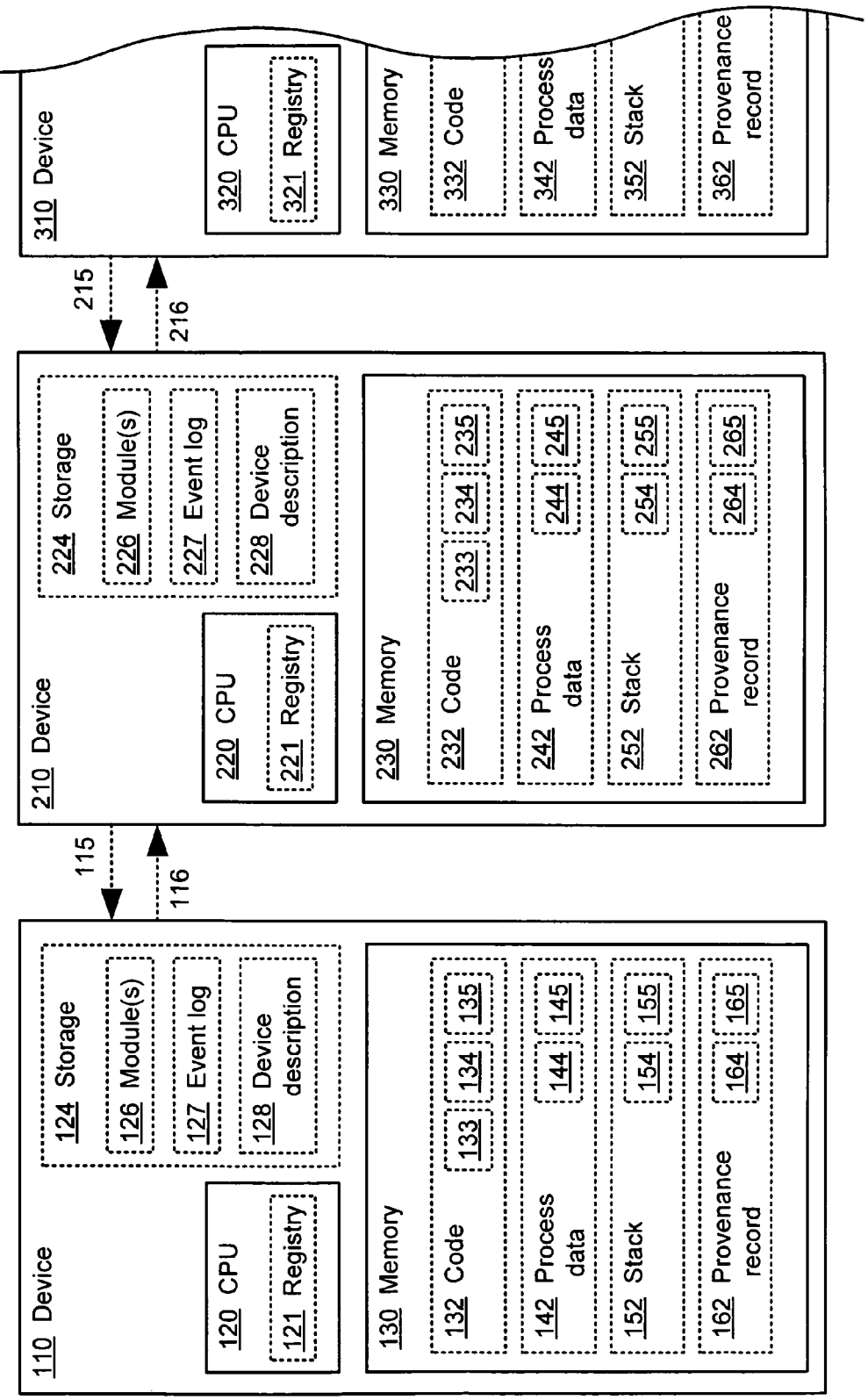
FIG. 2 depicts another exemplary environment in which one or more technologies may be implemented.

Referring now to FIG. 2, there is shown another exemplary environment in which one or more technologies may be implemented. Network zone 200 comprising linkages between device 110 and device 210, and between device 210 and device 310. One or both of signals 115, 116 can travel between device 110 and 210 as shown. Likewise device 210 can receive input signal 215 or send output signal 216, and can accordingly transmit messages between device 110 and device 310 as needed. In some embodiments, input signal 215 and output signal 216 are radio frequency signals or signals of some other wireless protocol. In some embodiments, input signal 215 and output signal 216 can be bandwidth-limited, such as when passing through a portable, battery-powered device or other bandwidth-limited linkage.

Device 110 includes CPU 120 and memory 130, and can include storage 124. CPU can include registry 121 containing one or more registers. Storage 124 can contain one or more of module(s) 126, event log 127, or device description 128. Memory 130 can contain one or more of modules 133, 134, 135 of code 132, one or more components 144, 145 of process data 142, one or more states 154, 155 in stack 152, or one or more portions 164, 165 of provenance record 162.

Device 210 likewise includes CPU 220 and memory 230, and can include storage 224. CPU can include registry 221 containing one or more registers. Storage 224 can contain one or more of module(s) 226, event log 227, or device description 228. Memory 230 can contain one or more of modules 233, 234, 235 of code 232, one or more components 244, 245 of process data 242, one or more states 254, 255 in stack 252, or one or more portions 264, 265 of provenance record 262.

Device 310 likewise includes CPU 320 and memory 330. CPU can include registry 321 containing one or more registers. Memory 330 can contain one or more of code 332, process data 342, stack 352, or provenance record 362.

Figure 3:
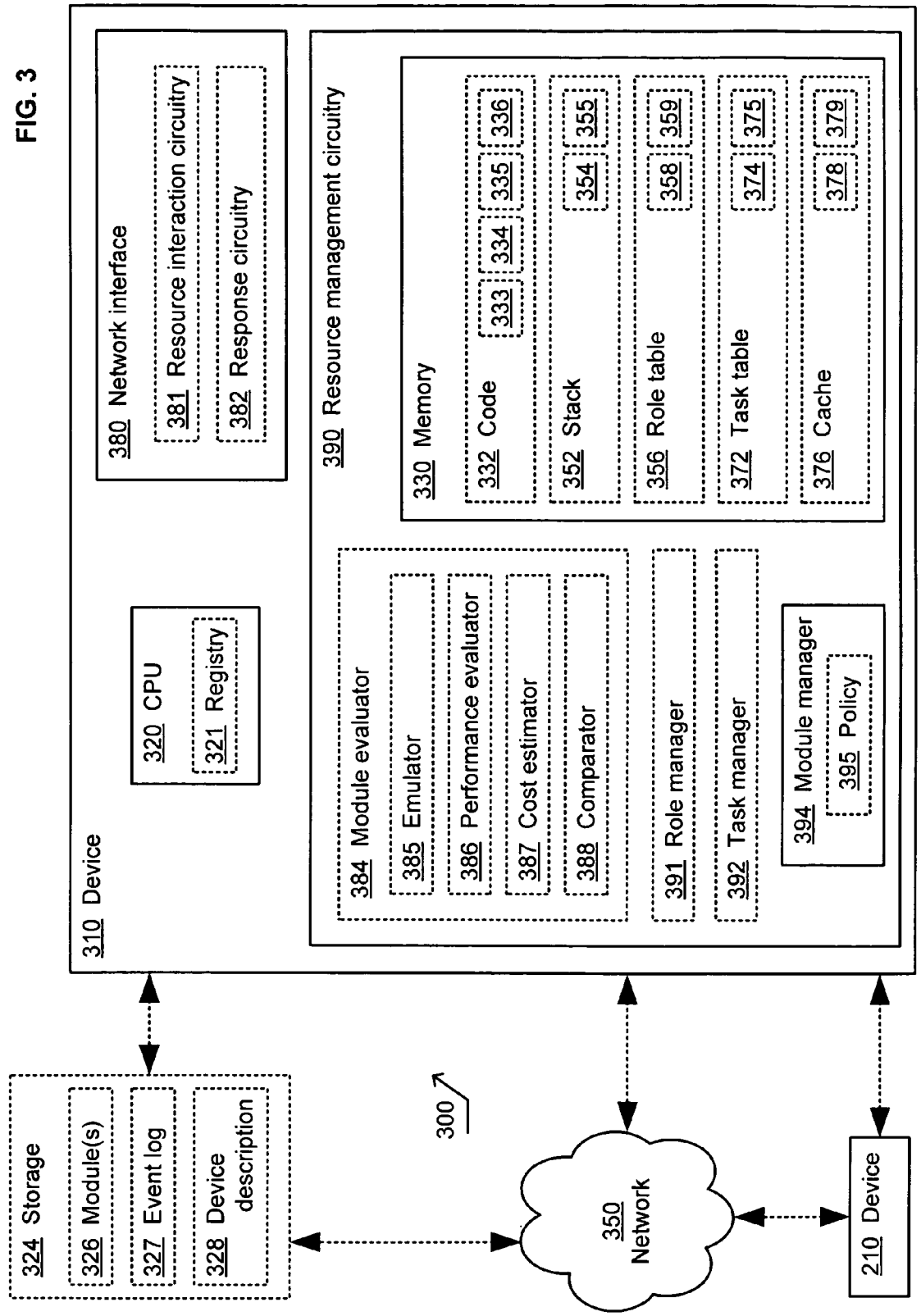
FIG. 3 depicts another exemplary environment in which one or more technologies may be implemented.

Referring now to FIG. 3, there is shown another exemplary environment in which one or more technologies may be implemented. FIG. 3 depicts a variant in which device 310 can be configured to cooperate with external storage 324 and with network 350 as well as device 210 of FIG. 2. In some embodiments, part or all of device 310 can be implemented as a virtual machine, optionally one that can be physically distributed across two or more physical devices.

System 300 includes device 310 and can include storage 324. Storage 324 can include one or more of module(s) 326, event log 327, or device description 328. Device 310 still includes CPU 320 with registry 321, and also includes network interface 380 and resource management circuitry 390. Network interface 380 can include resource interaction circuitry 381 for interacting with resource management circuitry 390, as described below. Network interface 380 can likewise include response circuitry 382 for interacting with storage 324, network 350, or device 210.

Resource management circuitry includes memory 330 and module manager 394, and can also include module evaluator 384, role manager 391, or task manager 392. Module evaluator can include one or more of emulator 385, performance evaluator 386, cost estimator 387, or comparator 388. Module manager 394 can include policy 395, which can be implemented or altered as described below. Memory 330 can contain one or more of modules 333, 334, 335, 336 of code 332, one or more states 354, 355 of stack 352, one or more portions 358, 359 of role table 356, one or more portions 374, 375 of task table 372, or one or more blocks 378, 379 of cache 376.

Those skilled in the art will recognize a variety of implementations of any of these items, in light of these teachings. In some embodiments, for example, module evaluator 384 can be included and configured, in some embodiments, to evaluate one or more modules according to one or more benefits or costs of each. Module evaluator 384 can include one or more of emulator 385, performance evaluator 386, cost estimator 387, or comparator 388.

A benefit of a single-role module can sometimes be estimated as a product or other cumulative function of a benefit of a single execution of the module and an approximate frequency of usage. In some embodiments, module evaluator 384 estimates a benefit of a multi-role module (module 135, e.g.) as the benefit of a most beneficial one of the roles or as a cumulative function of two or more of the roles of the module.

Referring now to FIG. 4, there is shown table 400, which can be an implementation of task table 372 or can be implemented as logic in task manager 392 or otherwise. Task record 410 can include one or more of task indicator 431, role indicator 441, node indicator 451, load indicator 461, user indicator 471, behavior indicator 481, or one or more other indicators 491. Task record 420 can likewise include one or more of task indicator 432, role indicator 442, node indicator 452, load indicator 462, user indicator 472, behavior indicator 482, or one or more other indicators 492. Many variations of table 400 are described herein, including several that omit one or more of fields 430 through 490.

Referring now to FIG. 5, there is shown table 500, a specific example of role table 356 that can likewise be implemented as logic in role manager 391 or otherwise. Role records 510-530 can include one or more of role indicators 441-443, node indicators 451-452, capacity indicators 551-552, module indicators 561-562, version indicators 571-572, behavior indicators 581-583, or one or more other indicators 591-593 as shown.

Figure 6:
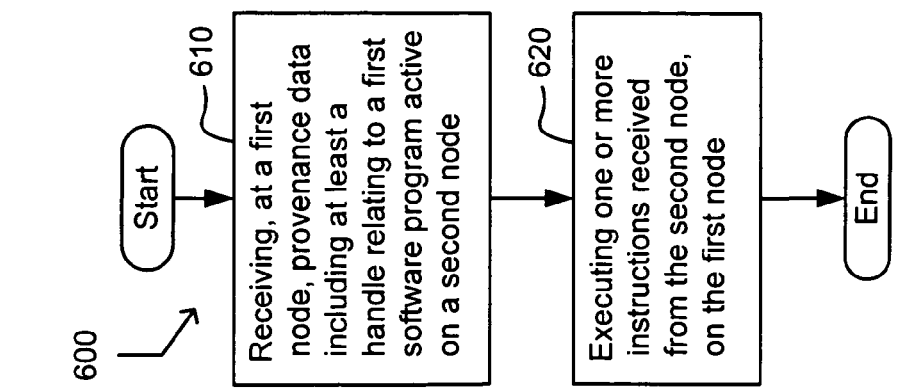
FIG. 6 depicts a high-level logic flow of an operational process.

Referring now to FIG. 6, there is shown a high-level logic flow 600 of an operational process. Operation 610 describes receiving, at a first node, provenance data including at least a handle relating to a first software program active on a second node (e.g. provenance record 162 or event log 127 of FIG. 2 receiving provenance data including the name(s) of one or more programs recently running on device 210). The provenance data can include other information about the program(s), the second node, or about other nodes as well.

Operation 620 describes executing one or more instructions received from the second node, on the first node (e.g. CPU 120 and module 134 jointly receiving a mobile program or the like). In some embodiments, the one or more instructions gather information about the first node, the second node, or the like. CPU 120 and other components of device 110 may also facilitate operations 610 and 620, as described below.

Figure 7:
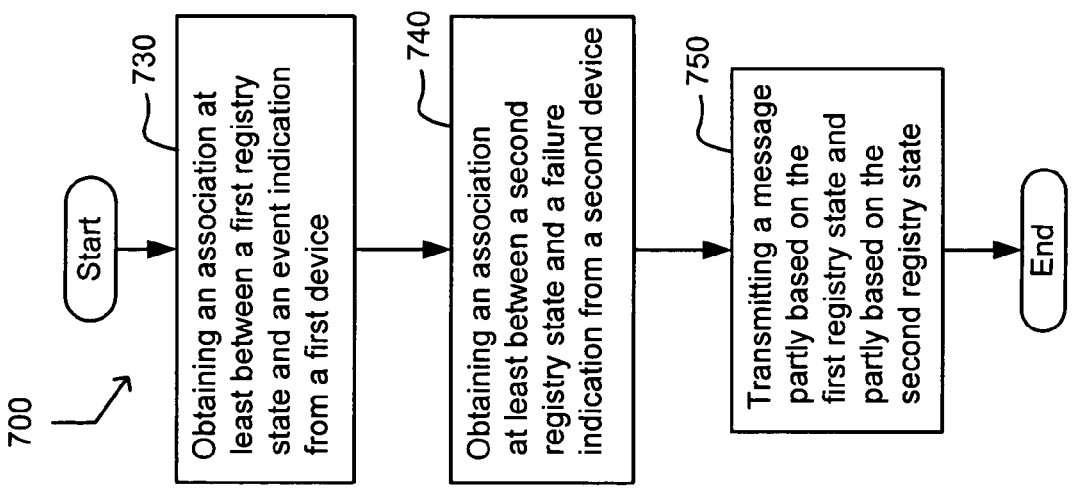
FIG. 7 depicts a high-level logic flow of another operational process.

Referring now to FIG. 7, there is shown a high-level logic flow 700 of another operational process. Operation 730 describes obtaining an association at least between a first registry state and an event indication from a first device (e.g. CPU 320 and module 334 jointly receiving a record containing one or more register values as well as an event description). Network interface 380 and other components of device 310 may also facilitate operation 710, as described below.

Operation 740 describes obtaining an association at least between a second registry state and a failure indication from a second device (e.g. CPU 320 and module 335 jointly receiving a record containing one or more register values as well as an event description). The failure indication can be a system crash, a minor warning message, a failure to achieve an objective, or the like.

Operation 750 describes transmitting a message partly based on the first registry state and partly based on the second registry state (e.g. CPU 320 and module 336 jointly generating a diagnostic message). Module 336 can comprise a standalone program, a library module, one or more program parameters, a portion of another module, or the like.

Figure 8:
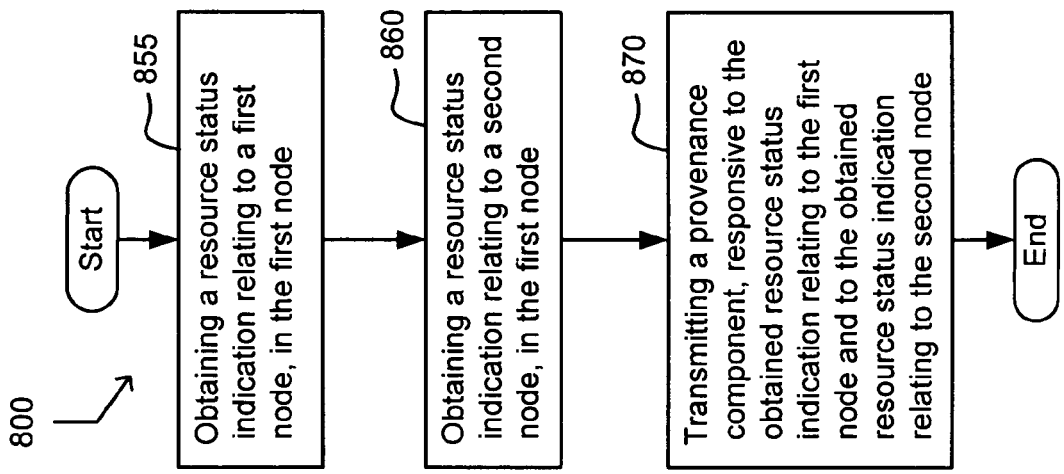
FIG. 8 depicts a high-level logic flow of another operational process.

Referring now to FIG. 8, there is shown a high-level logic flow 800 of an operational process. Operation 855 describes obtaining a resource status indication relating to a first node, in the first node (e.g. at least CPU 220 and event log 227 jointly recording periodic snapshots of registry 221 or an amount of free memory). The resource status indication can be a level, a description such as "transferring," a rate of progress, a list of currently or recently active entities, or the like.

Operation 860 describes obtaining a resource status indication relating to a second node, in the first node (e.g. at least CPU 220 and event log 227 jointly recording updates responsive to detected events relating to device 110). The resource status indication can be received directly from the "second" node (device 110, e.g.) or can be via a central or other zonal data collector (such as by a selective download of records from system 300, e.g.).

Operation 870 describes transmitting a provenance component, responsive to the obtained resource status indication relating to the first node and to the obtained resource status indication relating to the second node (e.g. at least CPU 220, event log 227, and module 233 jointly filtering or otherwise processing the status indications before transmitting them to network 350). To control the bulk of a provenance, network zone 200 can be configured to combine flow 800 with the flow of FIG. 9 or its variants as described below, for example by selectively trimming, augmenting, or deleting the provenance component.

Referring now to FIG. 9, there is shown a high-level logic flow 900 of an operational process. Operation 980 describes updating a provenance inclusion mode of a module, responsive to one or more mode control parameters (e.g. controller 70 and module 93 jointly increasing or decreasing a verbosity of a web crawler that appears to have behaved intermittently). Such control can be more important in bandwidth-limited contexts, such as when network 350 is implemented substantially as a wireless network.

Operation 990 describes deciding whether to include a first component in a provenance usage, responsive to the updated provenance inclusion mode (e.g. at least controller 70 deciding whether to include component 97 in process data 96 comprising a provenance record). Controller 70 can be executing part or all of module 94, for example. The provenance usage can comprise a decision whether to store some data in a central or other network zone, a routing determination, an automatic or manual corrective operation, or the like.

Referring now to FIG. 10, there is shown a high-level logic flow 1000 of an operational process. Operation 1010 describes obtaining an indication of an event in a first subsystem roughly contemporaneously with obtaining information pertinent to a state of a second subsystem (e.g. at least CPU 320 and event log 327 jointly receiving records describing a progress report on system 110 and a "secure" status on system 210). In some embodiments, module 333 and network interface 380 enable CPU 320 to receive and log such records from a population of mobile nodes or other subsystems.

Operation 1020 describes transmitting an evaluation of the event in the first subsystem, responsive to the information pertinent to the state of the second subsystem (e.g. at least CPU 320 indicating a crash or other event on system 110 as being independent of system 210, and transmitting that information to storage 324 or network 350). In some embodiments, module 333 enables CPU 320 to perform such evaluations selectively, such as by ignoring indications in a "healthy" category (a satisfactory progress report event, e.g.).

Referring now to FIG. 11, there is shown a high-level logic flow 1100 of an operational process. Operation 1130 describes obtaining a first code role indicator, an association between the first code role indicator and a first code module, and a second code role indicator (e.g. at least CPU 320 receiving a "1Scan22" module with that somewhat-descriptive name and an identifier of a program resident on device 210). In some embodiments, the one or more instructions gather information about the first node, the second node, or the like.

Operation 1140 describes deciding whether to install a second code module in a first node, responsive to a result of a comparison between the first code role indicator and the second code role indicator (e.g. at least module manager 394 deciding whether device 210 should install "1Scan22," retain the resident program, or do both or neither). In some embodiments, resident or remote resources (module evaluator 384 or module 334, e.g.) are requested to facilitate or otherwise enhance the decision process.

Figure 12:
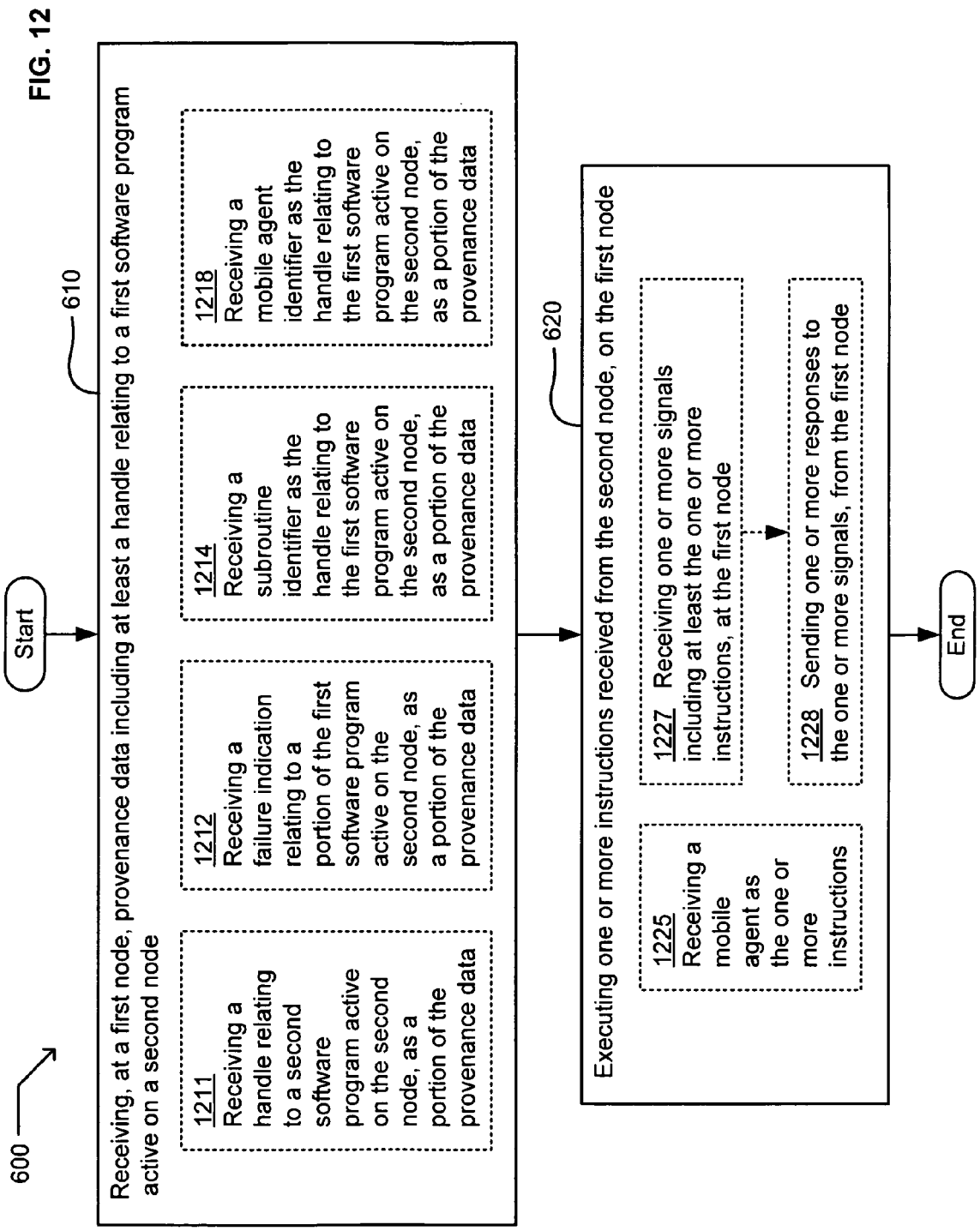
FIGS. 12-15 each depict several variants of the flow of FIG. 6.

Referring now to FIG. 12, there are shown several variants of the flow 600 of FIG. 6. Operation 610—receiving, at a first node, provenance data including at least a handle relating to a first software program active on a second node—may include one or more of the following operations: 1211, 1212, 1214, or 1218. Operation 620—executing one or more instructions received from the second node, on the first node—may include one or more of the following operations: 1225, 1227, or 1228.

Operation 1211 describes receiving a handle relating to a second software program active on the second node, as a portion of the provenance data (e.g. at least provenance record 162 of FIG. 2 receiving "EUG1," a name of a software program identifying a module 234 of code 232 running on device 210). Flows like these can occur in some embodiments in which at least storage 224 or memory 230 can receive parts of the provenance data. CPU 120 can jointly receive the provenance data as well, in many such cases.

It will be understood by those skilled in the art that operation 1211 and others described below can be used in many combinations, including flows shown above in FIGS. 7 through 11. Network zone 200 can, for example, be implemented to perform two or more of these flows, for example, even within the operation of a single mobile agent or subroutine. Module 334 can optionally be implements as such an agent, in many of these embodiments, or even as an infective agent like a virus. In other embodiments, module 334 can be implemented as a stationary program module, as will be apparent in each of the contexts described below.

Operation 1212 describes receiving a failure indication relating to a portion of the first software program active on the second node, as a portion of the provenance data (e.g. provenance record 162 receiving a "write error" code relating to component 244 and a subroutine name as component 245). In some embodiments, the named subroutine can be any function, procedure, or the like at least partially implemented as one or more encoded instructions.

Operation 1214 describes receiving a subroutine identifier as the handle relating to the first software program active on the second node, as a portion of the provenance data (e.g. event log 127 receiving "read_res" identifying a subroutine of a program active within the previous 3 days on device 310). The program may have been deleted or currently inactive, in some implementations, such as when residing in storage 224 as module(s) 226.

Operation 1218 describes receiving a mobile agent identifier as the handle relating to the first software program active on the second node, as a portion of the provenance data (e.g. event log 127 receiving "v7.1_upgrade," identifying a mobile agent beginning an action on device 310, as one of the processes recently running on device 310). Device 310 or system 300 can be the "second node," in this example embodiment.

Operation 1225 describes receiving a mobile agent as the one or more instructions (e.g. code 132 receiving the agent called "v7.2_upgrade" as module 134, executable by CPU 120). Those skilled in the art will recognize that this example does not limit operation 1225 to version 7.2 or upgrades, but fairly contemplates substantially any specific mobile agent, as necessary for implementing the variants described here in reference to FIG. 12. These teachings are exemplary in nature.

Operation 1227 describes receiving one or more signals including at least the one or more instructions, at the first node (CPU 120 and a portion of memory 130 cooperatively receiving one or more instructions of a mobile agent as input signal 115). In some embodiments, CPU 120 can assemble module 34 as a combination of instructions from device 210 and modes, instructions, or other attributes from device 310.

Operation 1228 describes sending one or more responses to the one or more signals, from the first node (e.g. CPU 120 sending feedback signal 116 as a response to device 210 to affirm the receipt of input signal 115). In some embodiments, it will be understood that portions of operation 1227 or operation 1228 can precede, overlap, or even interact with one or more other operations, such as operation 1212.

Figure 13:
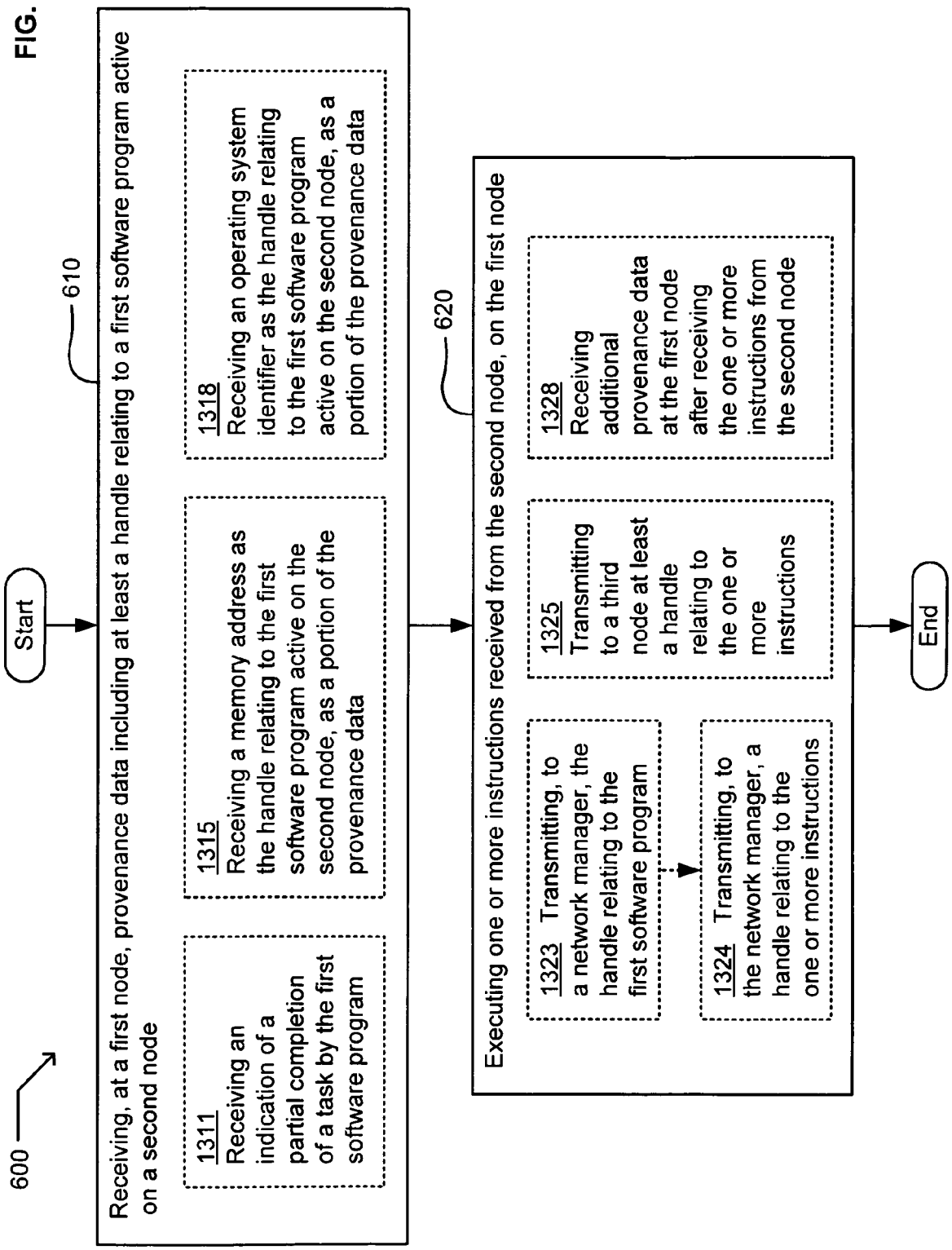

Referring now to FIG. 13, there are shown several variants of the flow 600 of FIG. 6 or 12. Operation 610—receiving, at a first node, provenance data including at least a handle relating to a first software program active on a second node—may include one or more of the following operations: 1311, 1315, or 1318. Operation 620—executing one or more instructions received from the second node, on the first node—may include one or more of the following operations: 1323, 1324, 1325, or 1328.

Operation 1311 describes receiving an indication of a partial completion of a task by the first software program (e.g. process data 242 receiving a task record indicating how many records remain to be processed by the first software program in device 310). The task record can resemble record 410, for example, also including one or more of a task indicator 431, a role indicator 441, a node indicator 451 (identifying a device 310 on which the program can be running), a load indicator 461, and the like. The number of records remaining to be processed can comprise one or more other indicators 491, for example. These flows may be performed, for example, in an embodiment in which the "first" node comprises device 210, in which memory 230 performs operation 610, and in which operation 620 can be performed jointly by CPU 220 and portions of memory 230.

Operation 1315 describes receiving a memory address as the handle relating to the first software program active on the second node, as a portion of the provenance data (e.g. event log 127 receiving input signal 115 indicating an address in memory 330 at which CPU 320 recently encountered an exception, and also indicating one or more programs or processes then running on device 310)

Operation 1318 describes receiving an operating system identifier as the handle relating to the first software program active on the second node, as a portion of the provenance data (e.g. provenance record 162 receiving "SUSE 10.1 Beta 4" as an identifier of an operating system running on device 210 when an exception was encountered on device 110 or device 210)

Operation 1323 describes transmitting, to a network manager, the handle relating to the first software program (e.g. controller 20 transmitting to a network manager on server 58 a filename identifying module 93 shortly after module 93 was apparently running on device 60). These flows may be performed, for example, in an embodiment in which state monitoring circuitry 24 performs operation 610 and in which controller 20 and memory 40 jointly perform flow 620 by executing module 43. In some other embodiments, neither server 58 nor any other network manager are used.

Operation 1324 describes transmitting, to the network manager, a handle relating to the one or more instructions (e.g. controller 20 transmitting to a network manager via interface 52 a pointer or other handle for executing or otherwise accessing module 43). In some embodiments, handles to such programs, instructions, or other software can be collected in a cumulative or current task table like that of table 400 or an event log like event log 127, for example.

Operation 1325 describes transmitting to a third node at least a handle relating to the one or more instructions (e.g. CPU 220 and provenance record 262 jointly transmitting as signal 115 a first portion 264 comprising one or more of a role name, a memory address, or a copy of the one or more instructions). These flows may be performed, for example, in an embodiment in which module 235 comprises the one or more instructions, and in which CPU 220 and module 235 jointly perform operation 620. Provenance record 262 may perform operation 610, alternatively or additionally, receiving a handle relating to the first software program as input signal 215.

Operation 1328 describes receiving additional provenance data at the first node after receiving the one or more instructions from the second node (e.g. event log 227 receiving an indication that the first software program has completed a task on device 310). Alternatively or additionally, the additional provenance data can include role indicator 442, which can be used as the handle for querying device 310 for an identifier of the software program (e.g. module indicator 561). Alternatively or additionally, the query can be directed to a nearby or other central table 500 to obtain one or more additional components of role record 510 such as capacity indicator 551, version indicator 571, behavior indicator 581, or the like. These flows may be performed, for example, in an embodiment in which the "first" node can be device 210, in which operation 610 can be performed by storage 224, and in which operation 620 can be performed jointly by CPU 220 and portions of memory 230. In some embodiments, also, operation 1325 and operation 610 can both be performed after beginning operation 620 (e.g. by beginning the execution before receiving the provenance data).

Figure 14:
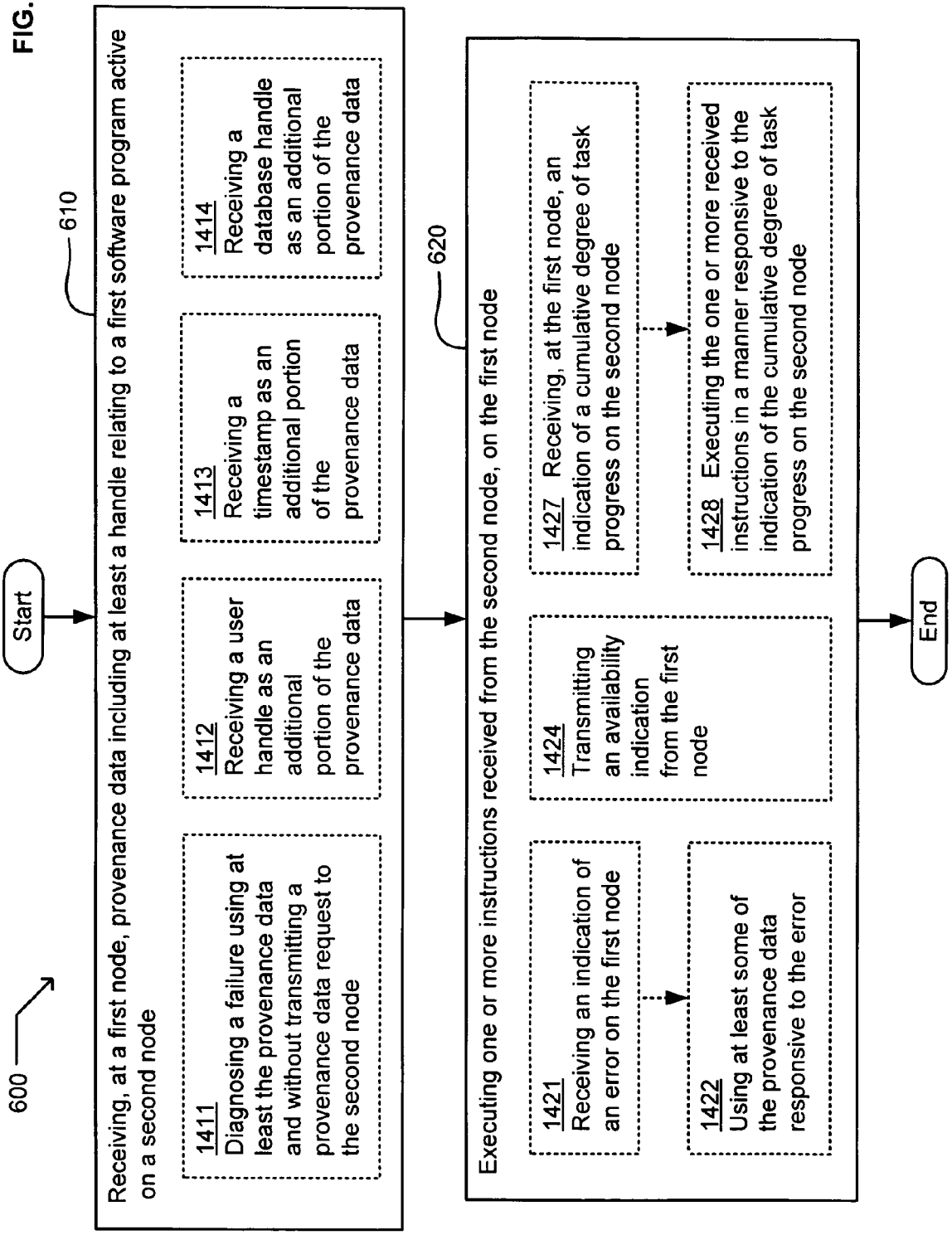

Referring now to FIG. 14, there are shown several variants of the flow 600 of FIG. 6, 12, or 13. Operation 610—receiving, at a first node, provenance data including at least a handle relating to a first software program active on a second node—may include one or more of the following operations: 1411, 1412, 1413, or 1414. Operation 620—executing one or more instructions received from the second node, on the first node—may include one or more of the following operations: 1421, 1422, 1424, 1427, or 1428.

Operation 1411 describes diagnosing a failure using at least the provenance data and without transmitting a provenance data request to the second node (e.g. CPU 220 and one or more portions of memory 230 jointly receiving a self-contained history of a mobile program appended to or otherwise included in the mobile program). This can occur, for example, in an embodiment in which code 232 receives the mobile program as module 235, and in which the diagnosis does not require any reference to provenance data of the mobile program elsewhere. The mobile program can refrain from keeping or can delete such provenance data in each of its instances, for example, appending each new item of provenance data onto its provenance record. Even when the provenance record can be limited to be no larger than the executable portion of such a mobile program, effective diagnosis of failures encountered by the mobile program can be achieved in many cases.

Operation 1412 describes receiving a user handle as an additional portion of the provenance data (e.g. task table portion 374 receiving a user ID or some other user indicator 471 with one or more other portions of record 410). These flows may be performed, for example, in an embodiment in which task table 372 receives role indicator 441 which, in turn, identifies the "first" software program as a code module in role table 356. Alternatively or additionally, CPU 320 and module 334 can jointly perform operation 620.

Operation 1413 describes receiving a timestamp as an additional portion of the provenance data (e.g. provenance record 162 receiving "11:37:08 AM" as a portion 165 of a provenance of module 235 or even of module 335). These flows may be performed, for example, in an embodiment in which provenance record 162 performs operation 610 and in which CPU 120 performs operation 620 by executing module 135.

Operation 1414 describes receiving a database handle as an additional portion of the provenance data (e.g. provenance record 162 receiving a handle of component 245 of process data 242 as a portion 164 of a provenance of module 235). These flows may be performed, for example, in the above-described embodiment in which provenance record 162 performs operation 610 and in which CPU 120 performs operation 620 by executing module 135.

Operation 1421 describes receiving an indication of an error on the first node (provenance record 162 receiving an indication of data corruption on device 210, together with a list of tasks in progress there within the past day, as portion 164). In some embodiments, a record for each task includes at least behavior indicator 482 and can also include one or more of task indicator 432, role indicator 442, node indicator 452, load indicator 462, user indicator 472, or other indicator 492. In some embodiments, the provenance for each task further includes one or more additional, role-specific or other module-specific items such as those exemplified in FIG. 5.

Operation 1422 describes using at least some of the provenance data responsive to the error (e.g. CPU 120 and module 133 using at least some of the provenance data for constructing an analysis task list). In some embodiments, for example, each of the modules of device 210 indicated in the provenance record can be retrieved and executed repeatedly in device 110, in a safe mode. When and if aberrant activity is observed in device 110, CPU 120 and module 134 can terminate the execution and jointly transmit to device 210 and others an indication that the retrieved module then running apparently contains corrupt data. Flows like this can occur, for example, in embodiments in which the "first" node is node 110.

Operation 1424 describes transmitting an availability indication from the first node (e.g. state notification circuitry 74 broadcasting to device 10 or server 58 an indication that device 60 is available to perform processing tasks). The indication may include one or more hardware or software attributes of device 60 such as storage or processing capacity, software configuration (such as identifiers of module 93, e.g.), ownership, or the like. These flows may be performed, for example, in an embodiment in which event monitoring circuitry 74 receives provenance data relating to one or more programs active on device 10, and in which controller 70 and memory 90 cooperatively execute the instruction(s) of module 94.

Operation 1427 describes receiving, at the first node, an indication of a cumulative degree of task progress on the second node (e.g. process data 96 receiving a 60% scanned file as process data 97 and a value of "60%" as process data 98). This can occur, for example, in embodiments in which device 10 has only finished 60% of scanning the file, and then passed the task to device 60, such as by spawning a mobile program. In some embodiments, a pointer to one or more files to be encoded, scanned or otherwise processed can be provided as the process data, instead of the file(s).

Operation 1428 describes executing the one or more received instructions in a manner responsive to the indication of the cumulative degree of task progress on the second node (e.g. controller 70 and module 95 jointly taking up the scanning task starting at about 60% into the received process data 97). In some embodiments, the cumulative degree indication includes a task number, a list of completed tasks, a list of tasks yet to perform, or the like.

Figure 15:
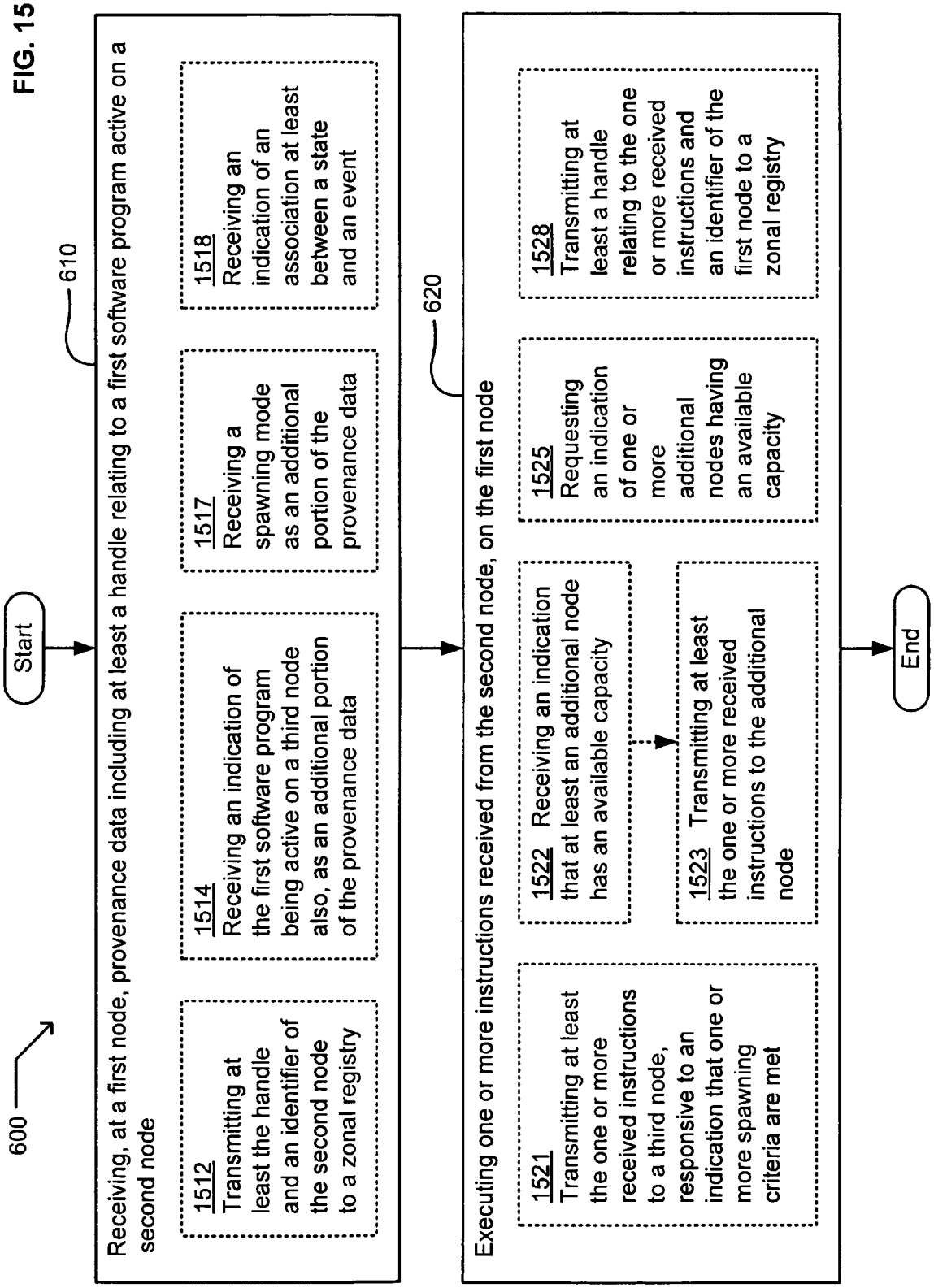

Referring now to FIG. 15, there are shown several variants of the flow 600 of FIG. 6, 12, 13, 14. Operation 610—receiving, at a first node, provenance data including at least a handle relating to a first software program active on a second node—may include one or more of the following operations: 1512,

1514, 1517, or 1518. Operation 620—executing one or more instructions received from the second node, on the first node—may include one or more of the following operations: 1521, 1522, 1523, 1525, or 1528.

Operation 1512 describes transmitting at least the handle and an identifier of the second node to a zonal registry (e.g. at least CPU 320 and module 334 jointly transmitting a name or pointer to a memory maintenance program on node 210). Flows like these can occur, for example, in embodiments in which role table 356 receives the provenance data including at least portion 358 relating to a first software program active (currently or recently) on node 210.

Operation 1514 describes receiving an indication of the first software program being active on a third node also, as an additional portion of the provenance data (e.g. task table 372 receiving an indication of a mobile program at least recently active on node 110 and node 210). In some embodiments, task table 372 also contains at least one record (as portion 375, e.g.) relating to one or more instructions simultaneously, overlappingly or subsequently executed in operation 620.

Operation 1517 describes receiving a spawning mode as an additional portion of the provenance data (e.g. role table 356 receiving at least an indication of whether an arrival of the first software program at the second node was precipitated by an error, a task sharing request, or the like). In some embodiments, role table 356 can include one or more fields from role record 510, including role indicator 441, node indicator 451, capacity indicator 551, behavior indicator 581, or the like. In some embodiments, the spawning mode is received as provenance data substantially only upon request, residing only in the program-sending system or other node until so requested or until deleted.

Operation 1518 describes receiving an indication of an association at least between a state and an event (e.g. event log 327 receiving an evaluation or logic table implementation indicating at least an association between a "sending" state in one machine and a data arrival event in another machine). In some embodiments, such associations can be complex, including circumstances and specifications of the machines and the like.

Operation 1521 describes transmitting at least the one or more received instructions to a third node, responsive to an indication that one or more spawning criteria have been met (e.g. CPU 320 and module 335 spawning a copy of module 335 to device 110). Flows like these can occur, for example, in embodiments in which role table 356 receives the provenance data including portions 358, 359 relating to a first software program active (currently or recently) on node 210, and in which at least CPU 320 and module 336 jointly perform operation 620.

Operation 1522 describes receiving an indication that at least an additional node has an available capacity (e.g. task manager 392 receiving an indication that device 110 has 80% free processing capacity). In some embodiments, task manager 392 also receives device description 128 from which a characterization of the free capacity and other resource indications can be generated.

Operation 1523 describes transmitting at least the one or more received instructions to the additional node (e.g. CPU and module 336 jointly spawning module 336 to operate on device 110, also or instead). Alternatively or additionally, in some embodiments, CPU and module 336 can jointly retrieve and transmit one or more module(s) 326 in storage 324.

Operation 1525 describes requesting an indication of one or more additional nodes having an available capacity (e.g. task manager 392 and network interface 380 jointly broadcasting a request into network 350 to identify suitable nodes for helping). Such a broadcast can result in task manager 392 performing operation 1522, for example.

Operation 1528 describes transmitting at least a handle relating to the one or more received instructions and an identifier of the first node to a zonal registry (e.g. at least CPU and module 333 transmitting, to device 110, a handle to module(s) 326 and a handle of the "first" node. In some embodiments, a zonal registry can be one of many mobile tasks active within a zone of nodes, almost any of which can be transferred responsive to detecting an overload on a node performing such tasks. In some embodiments, task manager selects for transfer a task that uses a disproportionally large quantity of a network resource. In a given zone, for example, a task manager may take actions toward making a percentage of free memory more uniform across nodes.

Figure 16:
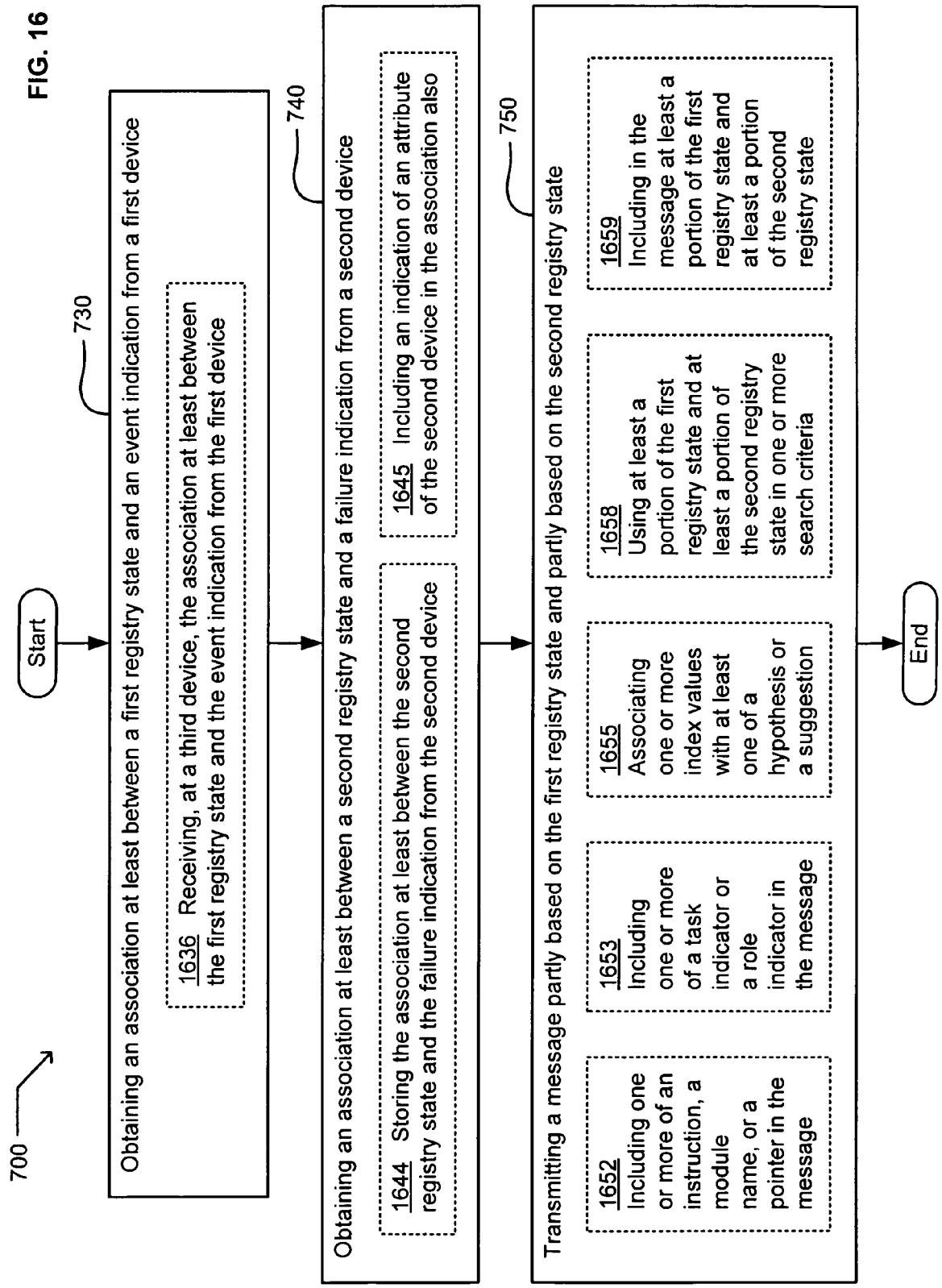
FIG. 16 depicts several variants of the flow of FIG. 7.

Referring now to FIG. 16, there are shown several variants of the flow 700 of FIG. 7. Operation 730—obtaining an association at least between a first registry state and an event indication from a first device—may include one or more of operation 1636 or the many other optional operations described herein. Operation 740—obtaining an association at least between a second registry state and a failure indication from a second device—may include one or more of the following operations: 1644 or 1645. Operation 750—transmitting a message partly based on the first registry state and partly based on the second registry state—may include one or more of the following operations: 1652, 1653, 1655, 1658, or 1659.

Operation 1636 describes receiving, at a third device, the association at least between the first registry state and the event indication from the first device (e.g. at least resource interaction circuitry 381 and cache block 378 receiving from device 110 a list of event descriptors, each with an event type and a pointer to a corresponding entry in event log 127). The first registry state can be a snapshot of registry 121, for example. Alternatively or additionally, event log 327 can receive a system crash indicator with a pointer to event log 227 at which an extensive record describing a system crash can be stored, for example.

Operation 1644 describes storing the association at least between the second registry state and the failure indication from the second device (e.g. at least event log 227 storing an association between one or more values of registry 227 and an indication that device 210 failed to meet a technical specification). Flows like these can occur, for example, in embodiments in which respective portions of resource management circuitry 390 can perform operations 730 and 740, and in which at least CPU 320 and module 335 jointly perform operation 750.

Operation 1645 describes including an indication of an attribute of the second device in the association also (e.g. at least cache 376 receiving part or all of device description 228 as block 379). In some embodiments, the description can include a current or recent hardware or software configuration, for example.

Operation 1652 describes including one or more of an instruction, a module name, or a pointer in the message (e.g. at least CPU 320 transmitting a patch for the apparent cause of a failure, as the message). In some embodiments, such a patch can be selected or retrieved at least partly based on items received in operation 740.

Operation 1653 describes including one or more of a task indicator or a role indicator in the message (e.g. at least CPU 320 and module 334 jointly including a SETI sub-task name or a subroutine name in a record later sent to event log 327 or to device 210). In some embodiments, an inclusion mode defines what other information is obtained or included in the message. See FIG. 18.

Operation 1655 describes associating one or more index values with at least one of a hypothesis or a suggestion (e.g. at least CPU 320 and module 334 jointly using an evaluation obtained for the message for another purpose also, such as developing a troubleshooting table indexed by the index values). In some embodiments, the index values can be generated from at least one of the first and second registry states. In some embodiments, the hypothesis can include one or more of a diagnosis describing a virus, a server crash, an operating system bug, or the like. In some embodiments, the suggestion can include one or more of contact information for an expert or other resource, a patch download link, or the like.

Operation 1658 describes using at least a portion of the first registry state and at least a portion of the second registry state in one or more search criteria (e.g. at least CPU 320 and module 334 jointly using portions of state 254 and state 154 as, or to generate, portions of a search term). In some embodiments, for example, these can be used to generate index values for use in making a database for searching and identifying and mining similar cases in which failures are encountered in a network. In some embodiments, these can be used for assembling search terms for mining an existing database or aggregate resource such as a search website.

Operation 1659 describes including in the message at least a portion of the first registry state and at least a portion of the second registry state (e.g. at least CPU 320 and module 335 jointly transmitting the message including these items to event log 327 or some other destination). In some embodiments, these indications can be used at least to help a programmer or user reviewing event log 327 to identify, with specificity, which specific failure modes are most common. This can be advantageous over a reporting system by which several distinct failure modes look identical, for example.

Figure 17:
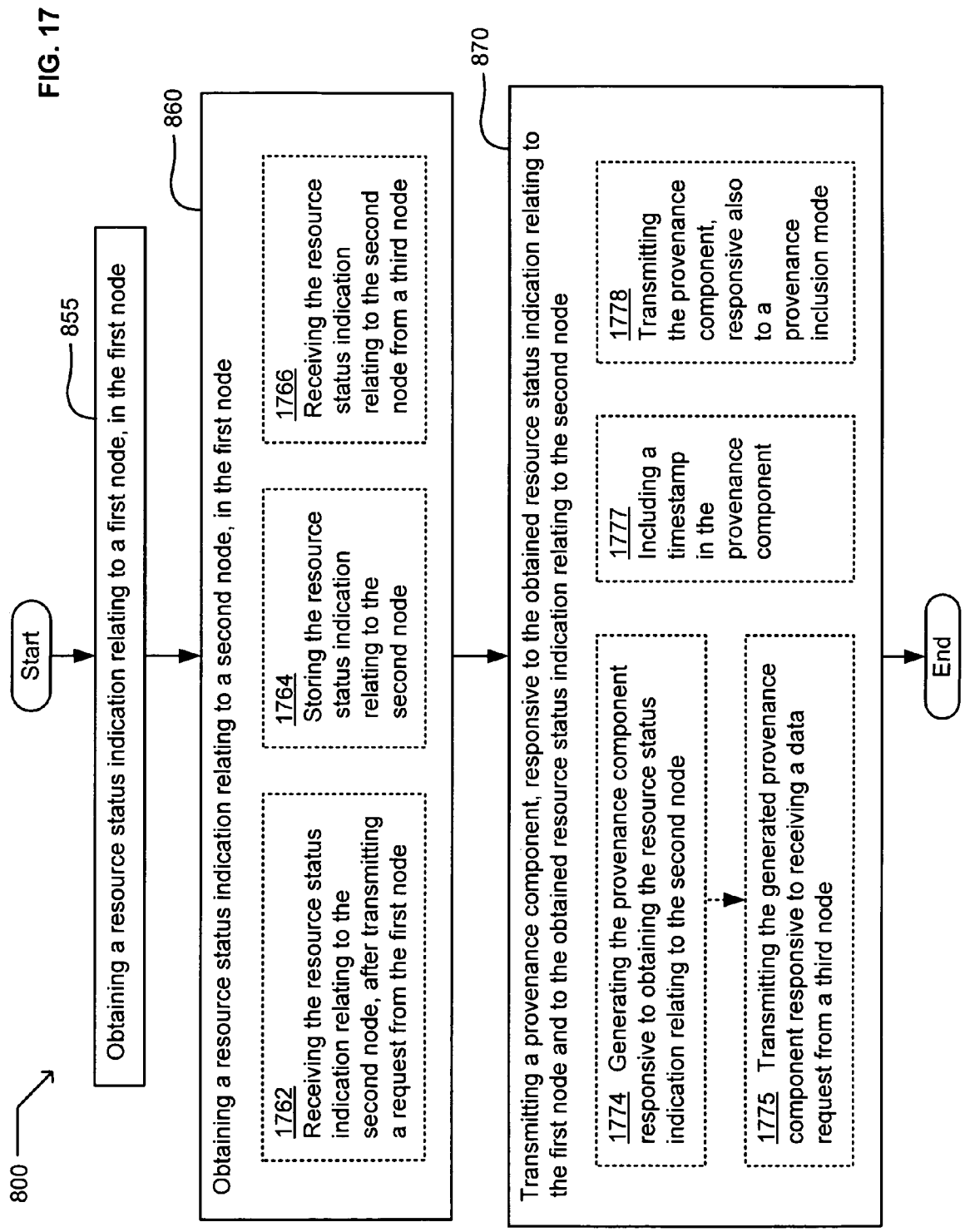
FIG. 17 depicts several variants of the flow of FIG. 8.

Referring now to FIG. 17, there are shown several variants of the flow 800 of FIG. 8. Operation 855—obtaining a resource status indication relating to a first node, in the first node—may include one or more of the many optional operations described herein. Operation 860—obtaining a resource status indication relating to a second node, in the first node—may include one or more of the following operations: 1762, 1764, or 1766. Operation 870—transmitting a provenance component, responsive to the obtained resource status indication relating to the first node and to the obtained resource status indication relating to the second node—may include one or more of the following operations: 1774, 1775, 1777, or 1778.

Operation 1762 describes receiving the resource status indication relating to the second node, after transmitting a request from the first node (e.g. at least stack 152 receiving a variable "Qstatus" value of zero after CPU 120 and code 133 jointly request the value of that variable from device 210). In some embodiments, the resource status indication can comprise a prediction concerning the upcoming availability of the second node (device 210, e.g.). Flows such as these can occur, for example, in embodiments in which module 134 can be used for performing operation 855, in which module 135 can be used for performing operation 860, and in which at least CPU 120 performs operation 870.

Operation 1764 describes storing the resource status indication relating to the second node (e.g. at least storage 124 logging an indication that device 310 is ready to begin, in event log 127). In some embodiments, many events concerning the availability of resources in the second node can be logged but only a most recent subset are preserved (imposing a limit of 100 kilobytes, for example).

Operation 1766 describes receiving the resource status indication relating to the second node from a third node (e.g. at least process data 145 receiving an extensive history about device 210 from system 300). In some embodiments, such transmissions pass through one or more intermediate nodes (device 210, e.g.).

Operation 1774 describes generating the provenance component responsive to obtaining the resource status indication relating to the second node (e.g. CPU 320 and cache 376 jointly generating the provenance component by indicating that none of the nodes in the network zone are apparently experiencing trouble as of 8:35:22 A.M.). In some embodiments at least one entry is included for each node, in a status table comprising the provenance component. Flows such as these can occur, for example, in embodiments in which module 334 can be used for performing operation 855, in which module 335 can be used for performing operation 860, and in which at least CPU 320 performs operation 870.

Operation 1775 describes transmitting the generated provenance component responsive to receiving a data request from a third node (e.g. CPU 320 and module 336 jointly transmitting the above-mentioned status table responsive to a request from device 110). In some embodiments, the status table can be held by storage 324 until retrieved by CPU 320.

Operation 1777 describes including a timestamp in the provenance component (e.g. CPU 320 and module 333 jointly including a timestamp in the provenance component indicating, for example, the time of transmitting of operation 870). In some embodiments, timestamps can be added to some or all status indication records in the provenance component. In other embodiments, timestamps are not included.

Operation 1778 describes transmitting the provenance component, responsive also to a provenance inclusion mode (e.g. module manager 394 and CPU 320 jointly transmitting the provenance component responsive to a determination that policy 395 so requires). In some embodiments, a provenance inclusion mode can be strict enough to preclude transmitting such a component.

Figure 18:
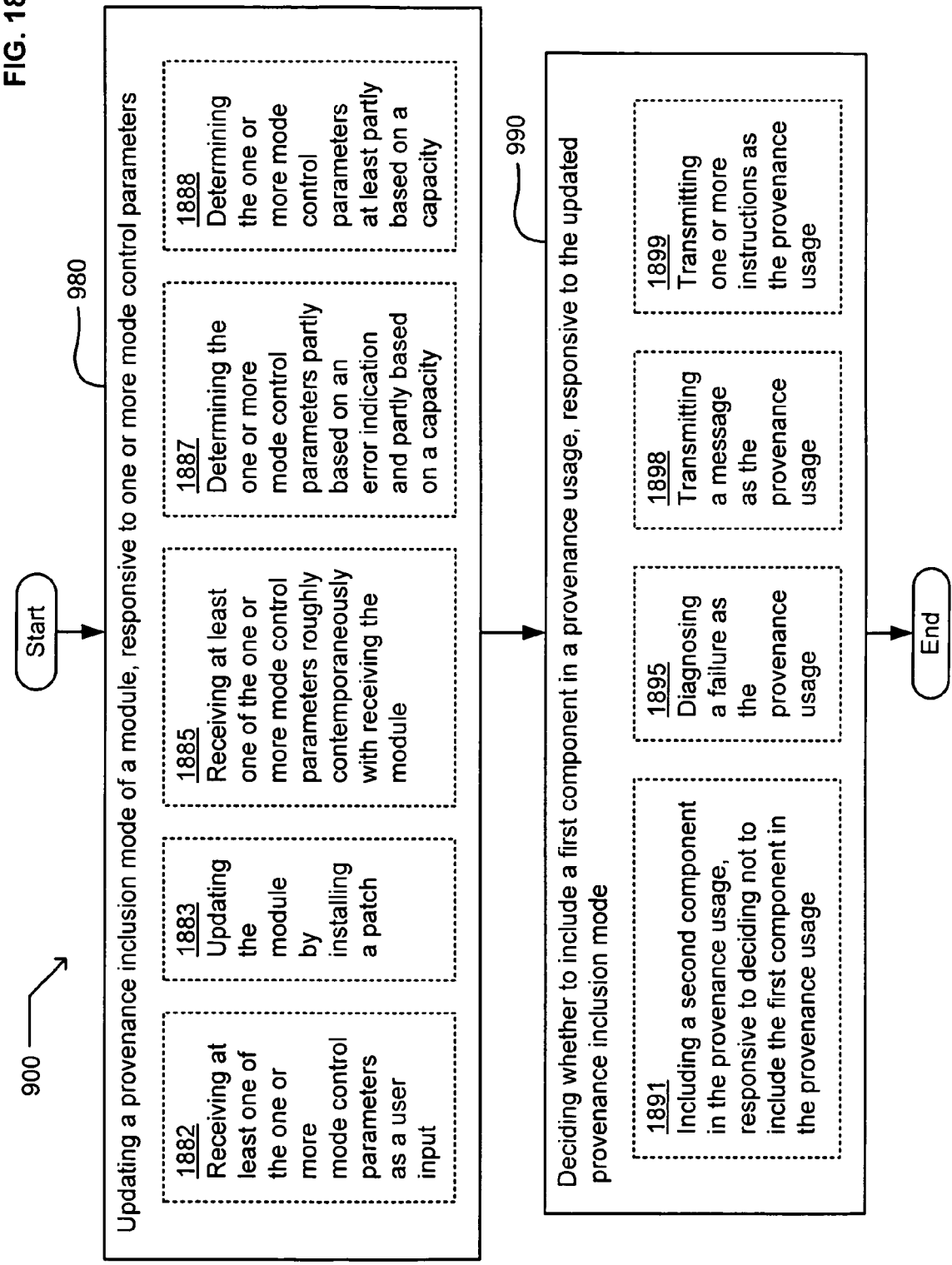
FIG. 18 depicts several variants of the flow of FIG. 9.

Referring now to FIG. 18, there are shown several variants of the flow 900 of FIG. 9. Operation 980—updating a provenance inclusion mode of a module, responsive to one or more mode control parameters—may include one or more of the following operations: 1882, 1883, 1885, 1887, or 1888. Operation 990—deciding whether to include a first component in a provenance usage, responsive to the updated provenance inclusion mode—may include one or more of the following operations: 1891, 1895, 1898, or 1899.

Operation 1882 describes receiving at least one of the one or more mode control parameters as a user input (e.g. event monitoring circuitry 76 of FIG. 1 receiving "low priority" and "high verbosity" as mode control parameters). In some embodiments, event monitoring circuitry receives such parameters via input device(s) 56 and network 50. A flow of this type can occur, for example, in embodiments in which controller 70 and module 93 jointly perform operation 980 and in which controller 70 and module 94 jointly perform operation 990.

Operation 1883 describes updating the module by installing a patch (e.g. controller 70 and module 93 using component 98 as a patch that alters a provenance inclusion mode of one or more module(s) 86 in storage 80, in the example of FIG. 1). Thereafter, if and when the altered module(s) are executed, the patch can cause the inclusion or exclusion of a component 98 of provenance data or other process data 96 generated during the execution or retained after the execution.

Operation 1885 describes receiving at least one of the one or more mode control parameters roughly contemporaneously with receiving the module (e.g. table 500 of FIG. 5 receiving provenance inclusion mode updates as "other" indicators 592, 593 shortly after receiving module 335 indicating by module indicator 562). A flow of this type can occur, for example, in embodiments in which role table 356 of FIG. 3 implements table 500, in which operation 980 can be performed by role manager 391, and in which operation 990 can be performed jointly by CPU 320 and module 335.

Operation 1887 describes determining the one or more mode control parameters partly based on an error indication and partly based on a capacity (e.g. CPU 320 selecting a high provenance inclusion responsive to detecting an error message in behavior indicator 582 that is apparently independent of overflow, fairly inferred from a capacity indicator 552 exceeding a nominal capacity value). A flow of this type can occur, for example, in embodiments in which role table 356 implements table 500, in which operation 980 can be at least partly performed by CPU 320, and in which operation 990 can be performed jointly by CPU 320 and module 335.

Operation 1888 describes determining the one or more mode control parameters at least partly based on a capacity (e.g. CPU 320 selecting a moderate provenance inclusion responsive to capacity indicator 552 falling within a moderate capacity range). Those skilled in the art will recognize a variety of other circumstances and ways in which a provenance inclusion mode can be updated and implemented automatically, in light of these teachings.

Operation 1891 describes including a second component in the provenance usage, responsive to deciding not to include the first component in the provenance usage (e.g. provenance record 262 of FIG. 2 including a concatenation or other summary of a portion 265, responsive to deciding not to include the entire portion 265). The concatenation or other summary can comprise portion 264, for example.

Operation 1895 describes diagnosing a failure as the provenance usage (e.g. CPU 320 and module 334 of FIG. 3 jointly generating an explanation or other hypothesis by analyzing provenance record 362). In some embodiments, voluminous provenance data tailored to a hypothesis can be gathered before the diagnosis and turned soon afterward.

Operation 1898 describes transmitting a message as the provenance usage (e.g. CPU 320 and module 335 transmitting at least a part of provenance record 362, a diagnosis, or the like to a zonal registry or a user). Those skilled in the art will recognize a variety of other circumstances and ways in which a useful provenance-related message can be transmitted, in light of these teachings.

Operation 1899 describes transmitting one or more instructions as the provenance usage (e.g. CPU 320 and module 335 of FIG. 3 transmitting at least a portion of module 335 to device 110 of FIG. 2, responsive to a warning message). In some embodiments, such a transmission can initiate or effectuate a transfer of part or all of a task from a currently active node (device 310, e.g.) to another node (device 110, e.g.).

Figure 19:
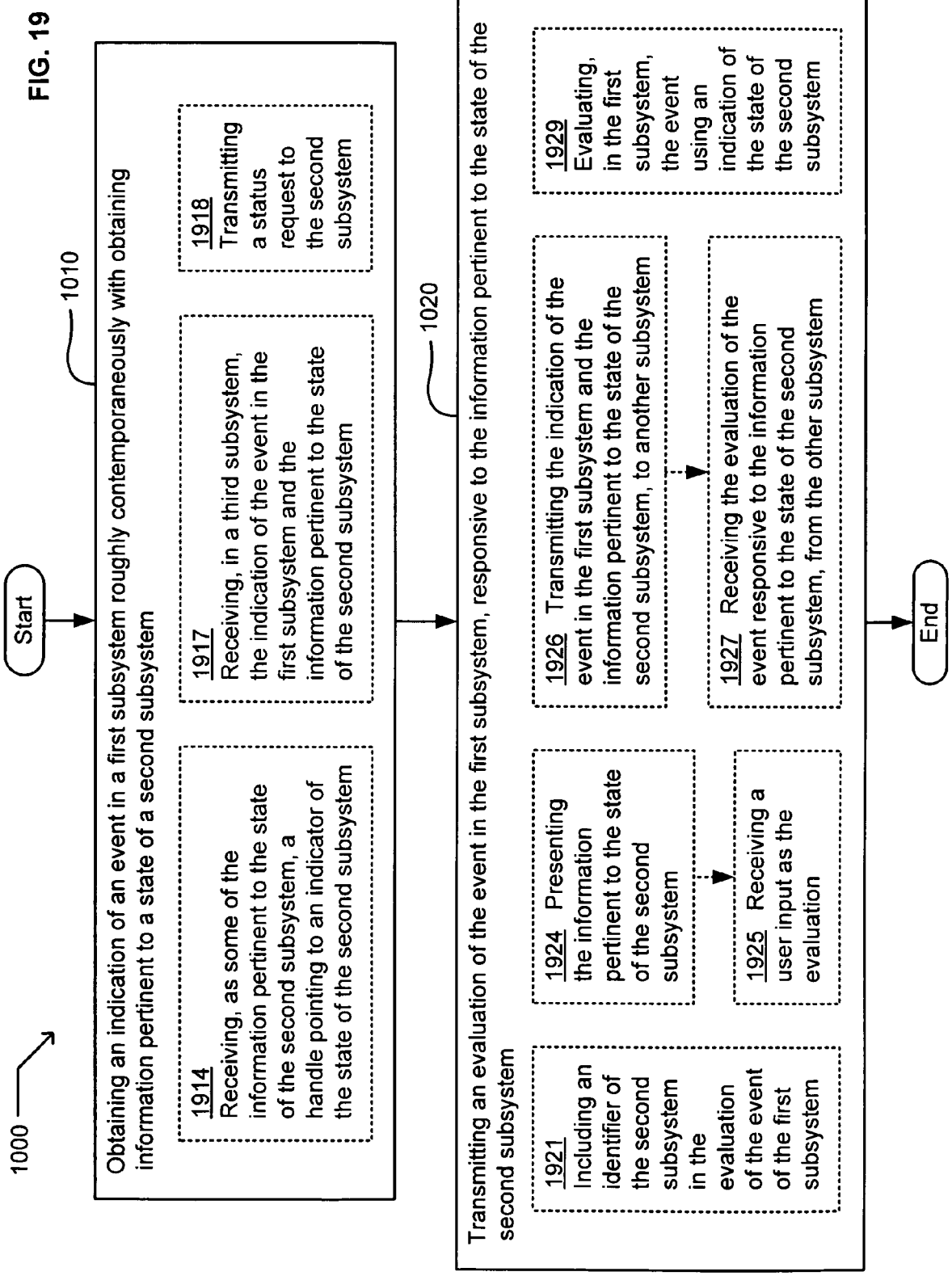
FIGS. 19-22 each depict several variants of the flow of FIG. 10.

Referring now to FIG. 19, there are shown several variants of the flow 1000 of FIG. 10. Operation 1010—obtaining an indication of an event in a first subsystem roughly contemporaneously with obtaining information pertinent to a state of a second subsystem—may include one or more of the following operations: 1914, 1917, or 1918. Operation 1020—transmitting an evaluation of the event in the first subsystem, responsive to the information pertinent to the state of the second subsystem—may include one or more of the following operations: 1921, 1924, 1925, 1926, 1927, or 1929.

Operation 1914 describes receiving, as some of the information pertinent to the state of the second subsystem, a handle pointing to an indicator of the state of the second subsystem (e.g. event log 38 of FIG. 1 receiving via state monitoring circuitry 24 a handle pointing to a portion of event log 88, which in turn can contain a detailed record of circumstances of the state of device 60). In some embodiments, the handle just points to a beginning of event log 88, which can contain timestamps from which some of these circumstances can be inferred. Flows like these can occur, for example, in embodiments in which operation 1010 can be performed by portions of controller 20, and in which operation 1020 can be performed jointly by controller 20 and module 43.

Operation 1917 describes receiving, in a third subsystem, the indication of the event in the first subsystem and the information pertinent to the state of the second subsystem (e.g. memory 55 receiving these items from event notification circuitry 26 and state notification circuitry 74, respectively). In some embodiments, these items can be stored at interface 52 or shown on display 54 to user 51. Flows like these can occur, for example, in embodiments in which operation 1010 can be performed jointly by display 54 and memory 55, and in which operation 1020 can be performed jointly by memory 55 and input device(s) 56. In some embodiments, interface 52 forces user 51 to input an evaluation of the event by selecting among a short list of alternatives such as "data error," "user error," "hardware error," "program code error," or "unknown error."

Operation 1918 describes transmitting a status request to the second subsystem (e.g. CPU 120 and module 133 of FIG. 2 jointly requesting an indication of whether device 210 has completed a backup operation). In some embodiments, the information pertinent to the state of the second subsystem can be obtained as a response to such a transmission. In some embodiments, while awaiting such a response, a time-out can be detected and used in generating the evaluation.

Operation 1921 describes including an identifier of the second subsystem in the evaluation of the event of the first subsystem (e.g. controller 20 executing module 44 of FIG. 1 and generating the evaluation to include at least the event indication and the state-pertinent information, together with subsystem identifiers for each). In some embodiments, several instances of such state-pertinent information can be gathered, each from or otherwise relating to a respective subsystem in a connective proximity to the device on which the event occurred (device 110 of FIG. 2, e.g.).

Operation 1924 describes presenting the information pertinent to the state of the second subsystem (e.g. device 10 transmitting indications of task states in device 60 and of other active devices on network 50 to interface 52 so that user 51 can view them on display 54). In some embodiments, for example, user 51 can view event log 38 or event log 88 with a browser, for example, containing such state information as well as event information. In some embodiments controller 20 can generate one or more suggestions, inferences with supporting data for each, or other tentative information also presented to user 51.

Operation 1925 describes receiving a user input as the evaluation (e.g. process data 46 receiving the user input as component 48). The user input can include one or more hypotheses or experience records expressed in textual form, for example.

Operation 1926 describes transmitting the indication of the event in the first subsystem and the information pertinent to the state of the second subsystem, to another subsystem (e.g. CPU 120 and module 134 jointly transmitting a mode change event in device 110 and an activity level of CPU 220 to system 300 for evaluation or other handling). In some embodiments, the state-pertinent information can first be obtained using an earlier-received pointer, such as by CPU 120 retrieving a state 254 from stack 252 using the pointer.

Operation 1927 describes receiving the evaluation of the event responsive to the information pertinent to the state of the second subsystem, from the other subsystem (e.g. by receiving any of the evaluations from system 300 described in this document). These variants can include one or more of the many operations described herein, for example in reference to elements of FIG. 3.

Operation 1929 describes evaluating, in the first subsystem, the event using an indication of the state of the second subsystem (e.g. CPU 120 and module 135 jointly generating a severity indication of an error event using one or more state indicators from each subsystem directly connected to the first subsystem). In some embodiments, for example, device 210 is the only node connected to device 110 purely through passive media, for example. In some embodiments, the event on device 110 can be evaluated just as a stand-alone device would be, responsive to receiving healthy indications substantially contemporaneously with detecting the error event. In such embodiments, for example, only "unhealthy" indications can be deemed to warrant network-level analysis.

Figure 20:
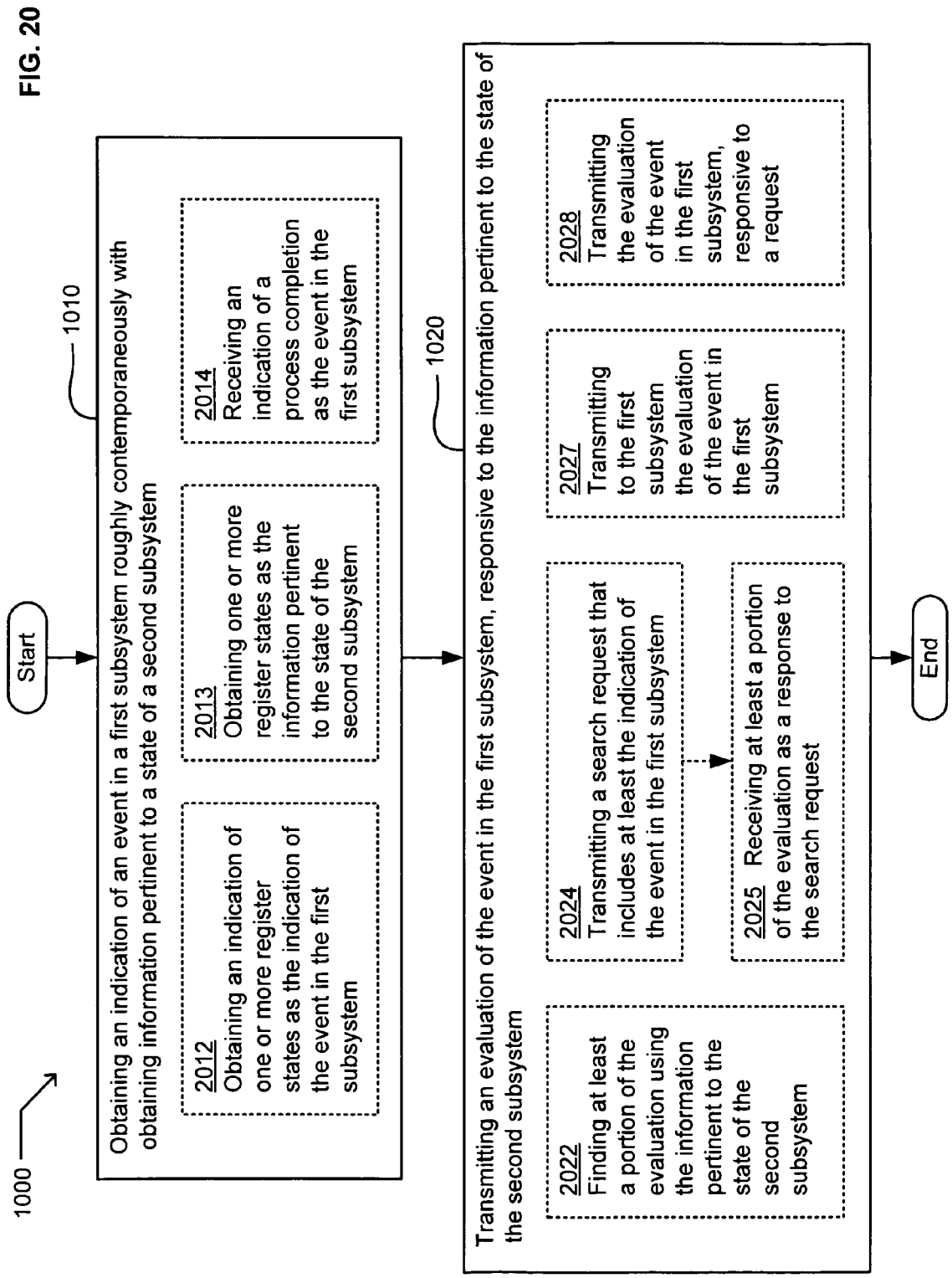

Referring now to FIG. 20, there are shown several variants of the flow 1000 of FIG. 10 or 19. Operation 1010—obtaining an indication of an event in a first subsystem roughly contemporaneously with obtaining information pertinent to a state of a second subsystem—may include one or more of the following operations: 2012, 2013, or 2014. Operation 1020—transmitting an evaluation of the event in the first subsystem, responsive to the information pertinent to the state of the second subsystem—may include one or more of the following operations: 2022, 2024, 2025, 2027, or 2028.

Operation 2012 describes obtaining an indication of one or more register states as the indication of the event in the first subsystem (e.g. event log 38 or event log 88 logging one or more hexadecimal values from registry 22). This can occur, for example, in flow variants in which controller 20 and module 44 jointly perform operation 1020. In some embodiments, the evaluation can be transmitted to interface 52, server 58, event log 88, or elsewhere in network 50.

Operation 2013 describes obtaining one or more register states as the information pertinent to the state of the second subsystem (e.g. event log 38 or event log 88 logging one or more hexadecimal values from registry 22). This can occur, for example, in flow variants in which controller 70 and module 95 jointly perform operation 1020. In some embodiments, the evaluation can be transmitted to interface 52, server 58, event log 88, or elsewhere in network 50.

Operation 2014 describes receiving an indication of a process completion as the event in the first subsystem (e.g. event log 38 or event log 88 receiving one or more success-indicative messages from event notification circuitry, responsive to module 135 completing a task). In some embodiments, the process completion indication includes one or more records like task record 420 or role record 530. Event log 38 can receive one or more of task indicator 432, role indicator 442, node indicator 452, load indicator 462, user indicator 472, capacity indicator 55, module indicator 562, version indicator 572, behavior indicator 583 or other indicator 593. In some embodiments, event log 88 can likewise receive such records for each of several events. In some embodiments, the inclusion of one or more of these indicators depends upon a provenance inclusion mode updated or otherwise controlled according to any of the above-described variants of FIG. 18.

Operation 2022 describes finding at least a portion of the evaluation using the information pertinent to the state of the second subsystem (e.g. controller 20 searching table 500 using an indication that device 60 was down when an error device 10 encountered an error). The found portion(s) can include one or more of a diagnosis, a prognosis, a frequency indicator, a severity indicator, a suggestion, or the like that can advantageously be included or otherwise used for generating the evaluation. This can occur, for example, in an embodiment in which controller 20 and module 44 jointly perform operation 1010, in which event log 38 includes table 500, and in which controller and module 43 jointly perform module 1020. Those skilled in the art will recognize a variety of other hardware, software, and firmware configuration variants and flows in which operation 2022 and one or more other operations or flows can be included, in light of these teachings.

Operation 2024 describes transmitting a search request that includes at least the indication of the event in the first subsystem (e.g. controller 70 sending server 58 or another remote resource a request responsive to encountering an "unknown data type" or other read error). This can occur, for example, in an embodiment in which controller 20 and module 43 jointly perform operation 2024.

Operation 2025 describes receiving at least a portion of the evaluation as a response to the search request (e.g. process data 46 receiving a software modification in response). This can occur, for example, in an embodiment in which storage 30 receives one or more patches as module(s) 36.

Operation 2027 describes transmitting to the first subsystem the evaluation of the event in the first subsystem (e.g. CPU 320, executing a portion of module 336, transmitting to device 110 an indication that a slow processing rate there is likely due to a transitory load spike on device 210). Those skilled in the art will recognize that many flows of this type can occur, for example, in embodiments in which CPU 320, network interface 380, and one or more portions of resource management circuitry 390 jointly perform operation 1020. In some such embodiments, a subsystem (device 310, e.g.) broadcasts or posts such an evaluation to benefit components deciding whether to assign tasks to the first or second subsystem, improving network performance.

Operation 2028 describes transmitting the evaluation of the event in the first subsystem, responsive to a request (e.g. CPU 320, executing a portion of module 333, responding to a download request from network 350 for all evaluations generated in the past year). In some such embodiments, module 333 causes a retrieval of part or all of event log 327. Flows such as these can occur, for example, in embodiments in which CPU 320 can use module 333 to access storage 324, in which the "first" subsystem comprises device 110, and in which operation 1020 can be at least partly performed by components of device 310.

Figure 21:
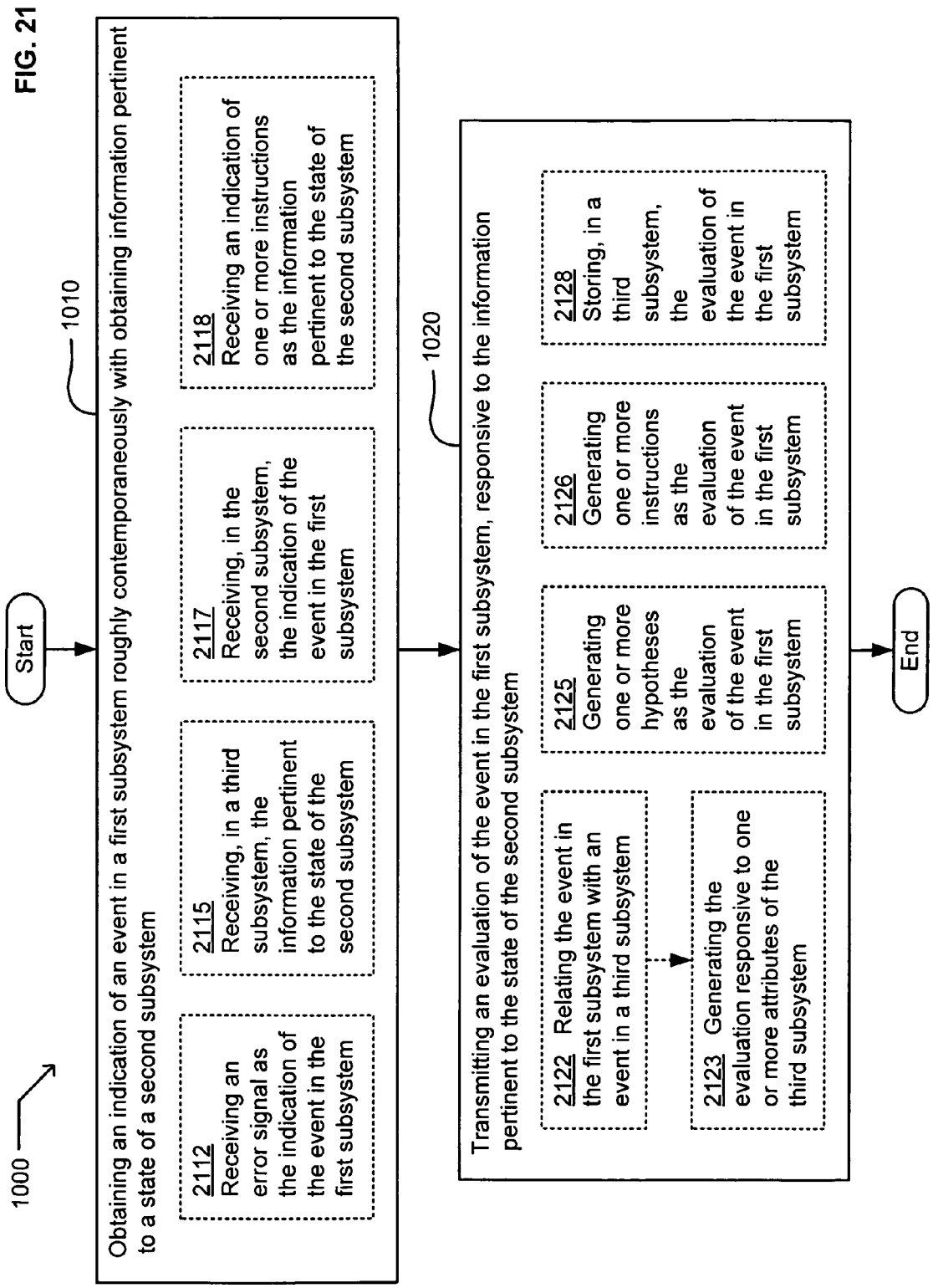

Referring now to FIG. 21, there are shown several variants of the flow 1000 of FIG. 10, 19, or 20. Operation 1010—obtaining an indication of an event in a first subsystem roughly contemporaneously with obtaining information pertinent to a state of a second subsystem—may include one or more of the following operations: 2112, 2115, 2117, or 2118. Operation 1020—transmitting an evaluation of the event in the first subsystem, responsive to the information pertinent to the state of the second subsystem—may include one or more of the following operations: 2122, 2123, 2125, 2126, or 2128.

Operation 2112 describes receiving an error signal as the indication of the event in the first subsystem (e.g. event log 327 of system 300 receiving a digital transmission including a log of a crash of node 110). In some embodiments, event log 327 frequently records progress reports of pending tasks as well. In some embodiments, event log 327 receives no error indications. Flows such as these can occur, for example, in embodiments in which operation 1010 can be performed by portions of system 300 receiving at least a part of output signal 216. In other embodiments, other components of network 350 can perform operation 1010 using output signal 216.

Operation 2115 describes receiving, in a third subsystem, the information pertinent to the state of the second subsystem (e.g. CPU 320 and module 335 jointly determining that device 210 appears normal, based on a succession of periodic operating values received as output signal 216). In some embodiments, CPU 320 can detect and document a substantial transition in a state parameter as an event in event log 327. In some embodiments, one or more criteria such as a crossed threshold can constitute an event precipitating such a recording, even when caused by a small parametric transition. This can be a useful feature for detecting certain problems, such as memory leaks.

Operation 2117 describes receiving, in the second subsystem, the indication of the event in the first subsystem (e.g. event log 227 initially receiving the event indication). This can occur, for example, in embodiments in which the event indication and the state-pertinent information can be aggregated in the second subsystem, later to be contemporaneously provided to a third subsystem (system 300, e.g.) for evaluation, archiving, or other data handling operations.

Operation 2118 describes receiving an indication of one or more instructions as the information pertinent to the state of the second subsystem (e.g. cache 376 receiving, as block 379, a copy of executable code recently in use on device 210). Similarly, storage 324 can receive a copy of one or more modules installed on device 210 as module(s) 326. In other embodiments, the one or more instructions comprise a portion of a mobile program spawning a copy on device 310 from device 210. Flows such as these can occur, for example, in embodiments in which operation 1010 can be performed by portions of system 300 receiving at least a part of output signal 216.

Operation 2122 describes relating the event in the first subsystem with an event in a third subsystem (e.g. CPU 320 and module 334 jointly recognizing a write error in storage 124 from one or more symptoms like those observed earlier in storage 324). This can occur, for example, in embodiments in which CPU 320 and one or more portions of resource management circuitry 390 jointly perform operation 1020. This exemplifies a commonality or similarity relationship, but the relation of operation 2122 can likewise be causal, historical, analogous, structural, or the like. Any of these types of relationships can facilitate an evaluation.

Operation 2123 describes generating the evaluation responsive to one or more attributes of the third subsystem (e.g. modules 333 and 334 guiding CPU 320 to determine that storage 324 reports errors in the same manner as storage 124). If storage 124 and storage 324 use the same protocol, for example, any event code that was previously diagnosed as a write error on the related subsystem (storage 324, e.g.) can become a more likely explanation of an unexplained event on the "first" subsystem (device 110 or storage 124, e.g.). In some embodiments, the evaluation can be a report with a likelihood (such as a percentage) for each of the one or more hypotheses.

Operation 2125 describes generating one or more hypotheses as the evaluation of the event in the first subsystem (e.g. controller 70 and module 95 jointly generating the evaluation as a message that a circuit of controller 20 may be latched up). In some implementations, the hypotheses may include an indication that one or more corrective actions (rebooting, installing, replacing, or the like, e.g.) may enhance a system performance. In one implementation, state notification circuitry 74 can then transmit to display 54 or memory 55 an e-mail containing that message.

Operation 2126 describes generating one or more instructions as the evaluation of the event in the first subsystem (e.g. modules 335 and CPU 320 jointly generating a patch or a request for a patch that may be effective for debugging device 210). In some embodiments, the one or more instructions include a reasonable user action like "hard reboot" or "defragment the disk drive" as an action addressing an apparent or possible deficit. In some embodiments, operation 1020 comprises creating, spawning, or otherwise guiding a mobile agent including the one or more instructions.

Operation 2128 describes storing, in a third subsystem, the evaluation of the event in the first subsystem (e.g. modules 336 and CPU 320 of FIG. 3 jointly storing the message in role table 356). In some variants, CPU 320 also requests or otherwise obtains a later status or event generally indicating a degree of success of the evaluation. Such a request can take the form of an e-mail or other electronic survey, for user-provided feedback. Alternatively or additionally, the evaluating subsystem (system 300, e.g.) can automatically query the "first" or other subsystem for one or more subsequent uploads (of event log 127 or event log 227, a week or a month later, e.g.).

Figure 22:
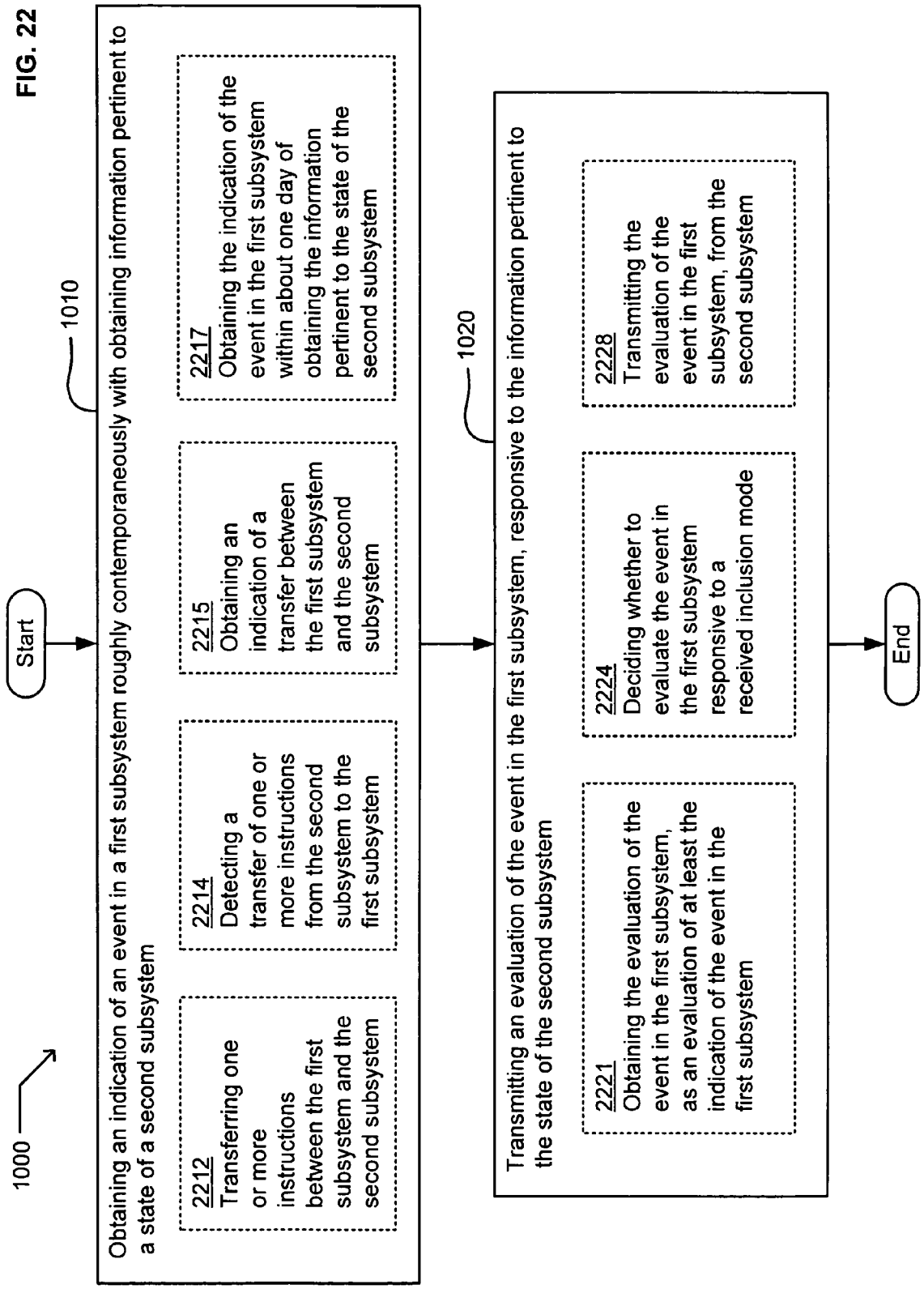

Referring now to FIG. 22, there are shown several variants of the flow 1000 of FIG. 10, 19, 20, or 21. Operation 1010—obtaining an indication of an event in a first subsystem roughly contemporaneously with obtaining information pertinent to a state of a second subsystem—may include one or more of the following operations: 2212, 2214, 2215, or 2217. Operation 1020—transmitting an evaluation of the event in the first subsystem, responsive to the information pertinent to the state of the second subsystem—may include one or more of the following operations: 2221, 2224, or 2228.

Operation 2212 describes transferring one or more instructions between the first subsystem and the second subsystem (e.g. controller 20 or controller 70 of FIG. 1 transferring a mobile upgrade agent through network 50 between device 10 and device 60, establishing at least one specific basis of association between these devices). In other embodiments, the roughly contemporaneously obtained items can relate to a network's subsystems selected at random or performed comprehensively. This latter strategy can be effective, for example, in detecting unexpected correlations between an event in one system affected by a state of another subsystem.

Operation 2214 describes detecting a transfer of one or more instructions from the second subsystem to the first subsystem (e.g. controller 20 detecting that controller 70 has transferred or will transfer video data from device 60 to device 10). In some embodiments, such a transfer can be detected by a third device such as server 58. Flows such as these can occur, for example, in embodiments in which controller 70 and module 94 jointly perform operation 1020.

Operation 2215 describes obtaining an indication of a transfer between the first subsystem and the second subsystem. (e.g. resource interaction circuitry 381 passing to event log 327 an indication that a channel has opened between device 210 and device 110). In some embodiments, resource interaction circuitry retains or acts on such indications on a selective basis, for example, by virtue of implementing a provenance inclusion mode (as described at FIG. 18 above, e.g.). Those skilled in the art will recognize a variety of other hardware, software, and firmware configuration variants and flows in which operation 2215 and one or more other operations or flows of FIG. 22 can be included, in light of these teachings.

Operation 2217 describes obtaining the indication of the event in the first subsystem within about one day of obtaining the information pertinent to the state of the second subsystem (e.g. event log 227 or event log 327 receiving an indication of device 210 being idle, the day before receiving an indication that device 110 being in a processing overload condition). Information of this kind can be useful in that it may indicate a failure of device 110 to detect or use device 210, which can block one or more mobile agents (in device 110, e.g.) from achieving a favorable load balancing. In some embodiments, these and other indications can be recorded in a common location within a few hours of detecting them.

Operation In some embodiments, each device can information relating to itself, such as by logging events on device 110 in event log 127 and by logging states of device 210 in event log 227. Flows like these can be performed, for example, in embodiments in which module manager 394 manages modules of several nodes (including device 110 and device 210, e.g.). Module manager can upload data from event log 127 or event log 227 in a maintenance mode, for example, by which all event log data can be received and processed from hundreds of nodes on a weekly or monthly basis. Resource management circuitry 390 and storage 324 can identify potentially meaningful associations between nodes of interest and otherwise complete operation 1020 in a variety of circumstances in which records can be obtained substantially contemporaneously from the respective nodes of interest.

Operation 2221 describes obtaining the evaluation of the event in the first subsystem, as an evaluation of at least the indication of the event in the first subsystem (e.g. comparator 388 of FIG. 3 determining that the string "abnormal data output" is unfavorable, and using the string "unfavorable" as the evaluation of an event that is not thoroughly understood). In some implementations, a very unfavorable evaluation of the state of the second subsystem can bear toward using "indeterminate" as the evaluation of the event, even when an evaluation of the indication is unfavorable. Such an event evaluation can be founded on a risk that the event indication may have been affected by a contemporaneous problem in the second subsystem, for example.

Operation 2224 describes deciding whether to evaluate the event in the first subsystem responsive to a received inclusion mode (e.g. CPU 320 or module evaluator 384 using one of the variants of FIG. 18 in deciding whether to accept an evaluation or to evaluate the event in some other manner). An evaluation may by transmitted or stored, for example, responsive to an indication of a "high verbosity" inclusion mode. In some embodiments, the inclusion mode affects whether a variety of analysis is performed at all, having substantially no effect on any provenance. Such task-inclusion mode control embodiments can be useful for leveraging free processing resources, for example, if such a mode is at least partly based on a processor loading level.

Operation 2228 describes transmitting the evaluation of the event in the first subsystem, from the second subsystem (e.g. controller 70 and module 95 jointly generating and transmitting an indication that device 10 has activated a firewall). Flows like these can occur, for example, in implementations in which controller 70 and module 93 perform operation 1020. Those skilled in the art will recognize a variety of other hardware, software, and firmware configuration variants and flows in which operation 2228 and one or more other operations or flows described herein can be included, in light of these teachings Referring now to FIG. 23, there are shown several variants of the flow 1100 of FIG. 11. Operation 1130—obtaining a first code role indicator, an association between the first code role indicator and a first code module, and a second code role indicator—may include one or more of the following operations: 2331 or 2334. Operation 1140—deciding whether to install a second code module in a first node, responsive to a result of a comparison between the first code role indicator and the second code role indicator—may include one or more of the following operations: 2341, 2342, 2344, 2346, or 2348.

Operation 2331 describes receiving the first code role indicator, the association between the first code role indicator and the first code module, and the second code role indicator in a zonal registry (e.g. role table 356 receiving "encoder," a pointer to a corresponding encoder program, and "data compression utility kit" in portions 358, 359 thereof). In some embodiments, role table 356 can indicate roles of modules across two or more nodes in a network zone, which can be useful for coordinating tasks or for optimizing a software configuration. Table 500, for example, includes a node indicator for each of role record 510, role record 520, and role record 530. In some embodiments, role indicators can be at least roughly similar for two or more roles in a zone (e.g. where role indicator 441 and role indicator 443 can be identical, and node indicator 451 and node indicator 452 indicate different nodes). In some embodiments, functional diversity can be better served within a zone by deleting a module having one or more of such similar or identical functions. In some embodiments, module manager 394 identifies mutually related role records and takes appropriate action in accordance with policy 395.

Operation 2334 describes receiving the first code role indicator, the association between the first code role indicator and the first code module, and the second code role indicator from a zonal registry (e.g. a simpler version of module manager 394, but one that can still keep track of which nodes can serve which roles in a network zone). In some embodiments in which components of device 210 perform operation 2334, for example, device 210 receives "DFT," a corresponding code module implementing a Discrete Fourier Transform, and "Compact Frequency Transform" from role table 356. (This can occur, for example, in an embodiment in which memory 90 performs operation 1130 by receiving these items as components 97, 98 of process data 96.) Having received these items in an invitation or request to install the latter, in this example embodiment, controller 70 can perform operation 1140 by deciding locally (in conjunction with code module 93, e.g.) whether to install the module containing the new frequency transform. Some network-level embodiments can be implemented without any zonal registry, in fact, deciding all such installation decisions locally, each within its corresponding node. Other network-level embodiments include a central or other zonal server configured to make all installation decisions for a multi-node zone (network 350 or a smaller zone, e.g.).

Operation 2341 describes configuring the first node to perform a portion of an aggregate processing task, responsive to one or more attributes of the aggregate processing task (e.g. task manager 392 and role manager 391 jointly configuring device 310 to optimize for assisting with a protein folding task, taking into account a task specification describing structural simulation sub-tasks comprising the task). A "self-configuration" flow of this type can occur, for example, in embodiments in which role table 356 performs operation 1130 and in which module evaluator 384 performs operation 1140.

Operation 2342 describes performing, at the first node, the comparison between the first code role indicator and the second code role indicator (e.g. performance evaluator 386 and comparator 388 jointly determining whether a module named "Enza" performs substantially better, faster, or more economically than a module named "Growth_31"). In some embodiments, no performance evaluator can be used, and comparator 388 always selects the higher-numbered revision, the newer module, the highest priority module, the option having the highest trust score, or the like. In some embodiments, module manager 394 implements a policy 395 of accepting a module indicated by comparator 388 only when comparator 388 indicates a substantial difference, such as by performing operation 2344 as described below. In some embodiments, one or more components of module evaluator 384 can be modified when network interface 380 receives a revision to policy 395.

Operation 2344 describes obtaining the result by evaluating a difference between the first code role indicator and the second code role indicator (e.g. comparator 388 determining that a substring "Enz" is thematically related to substring "Grow," and accordingly causing the module named "Growth_31" to be installed on a second node instead). This diversity-promoting flow can occur, for example, in an embodiment in which policy 395 promotes diversity, in which role table 356 performs operation 1130, and in which module evaluator 384 performs operation 1140.

Operation 2346 describes configuring the first node for sharing at least a data transformation component of an aggregate processing task with one or more other nodes (e.g. task manager 392 and role manager 391 jointly configuring device 210 to facilitate a ray tracing task, taking into account a task specification describing floating point function sub-tasks comprising the task). A zonal or other "external configuration" flow of this type can occur, for example, in embodiments in which role table 356 performs operation 1130 and in which module evaluator 384 performs operation 1140.

Operation 2348 describes deciding to delete the second code module at least partly based on the result of the comparison (e.g. role manager responding to comparator 388 by removing the association between the first code role indicator and the first code module from a table). In some embodiments, module evaluator 384 decides that the module is not needed, and transmits the decision via network interface 380, resulting in the deletion of the first code module from another device. Those skilled in the art will recognize a variety of other ways to communicate or implement the decision, in light of these teachings.

Figure 23:
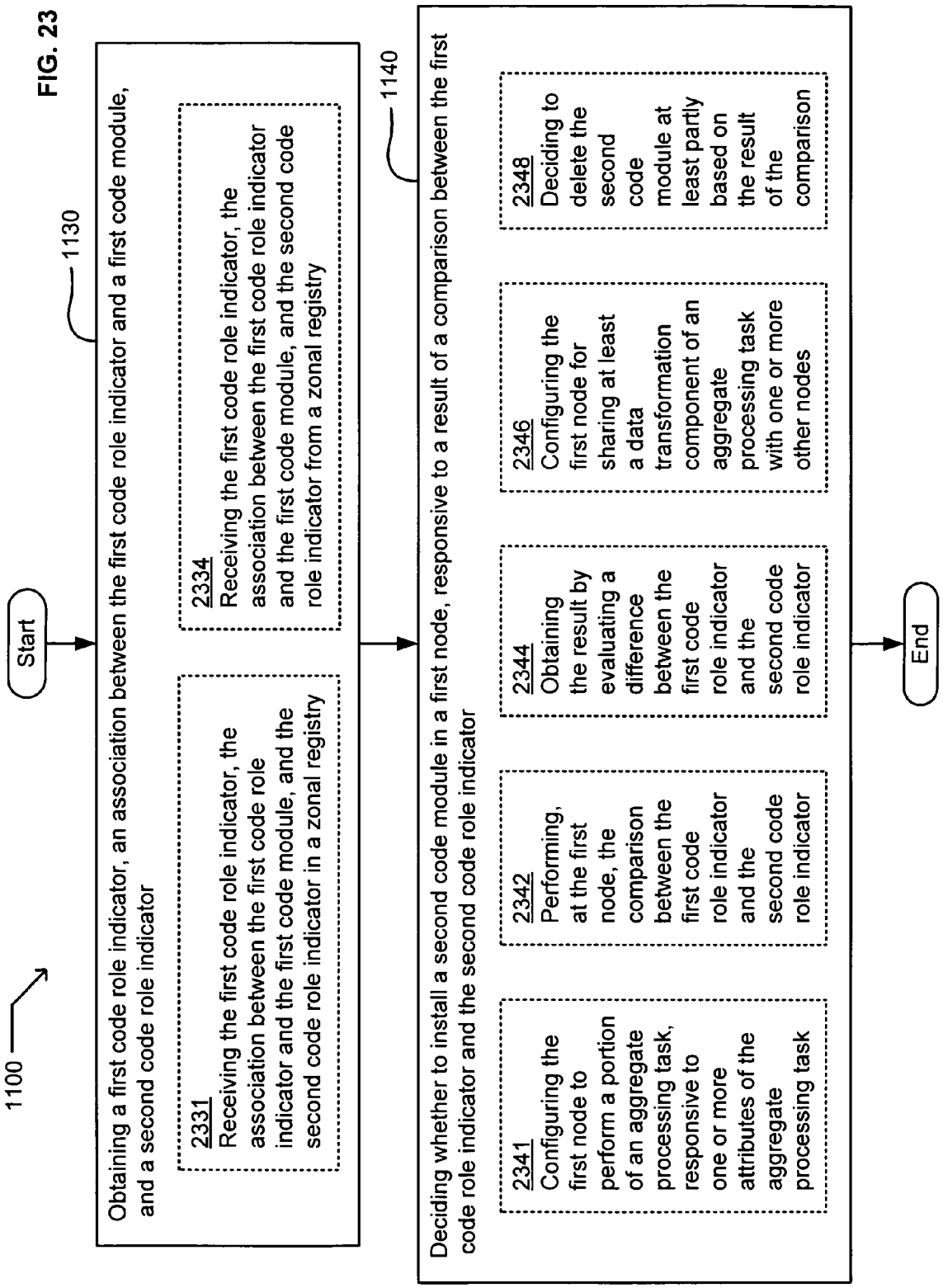
FIGS. 23-26 each depict several variants of the flow of FIG. 11.
Figure 24:
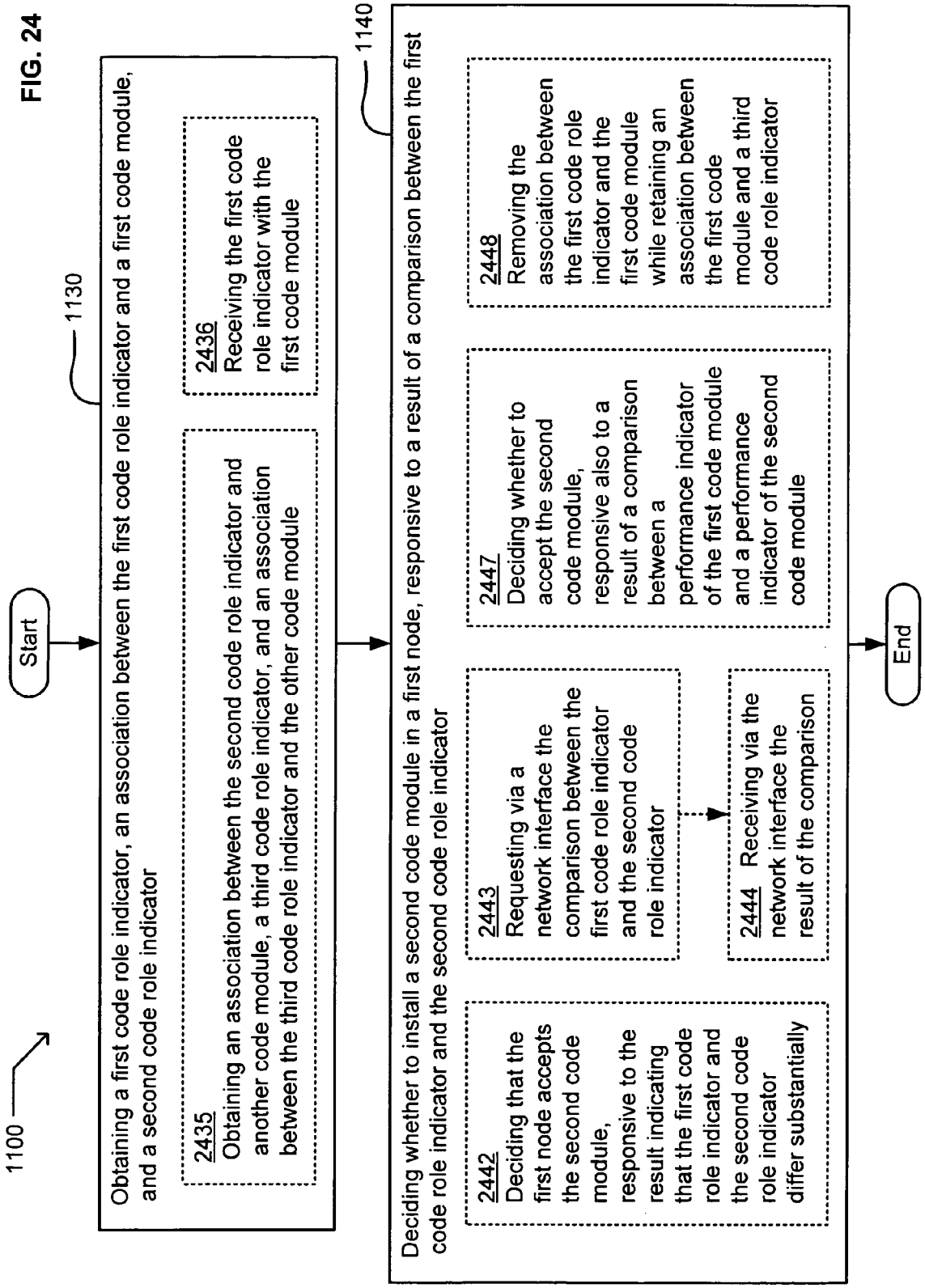

Referring now to FIG. 24 there are shown several variants of the flow 1100 of FIG. 11 or 23. Operation 1130—obtaining a first code role indicator, an association between the first code role indicator and a first code module, and a second code role indicator—may include one or more of the following operations: 2435 or 2436. Operation 1140—deciding whether to install a second code module in a first node, responsive to a result of a comparison between the first code role indicator and the second code role indicator—may include one or more of the following operations: 2442, 2443, 2444, 2447, or 2448.

Operation 2435 describes obtaining an association between the second code role indicator and another code module, a third code role indicator, and an association between the third code role indicator and the other code module (e.g. portion 358 of role table 356 receiving indications that the "other" module has "S2" and "S3" subroutines for serving the "second" and "third" code roles, respectively). In an embodiment in which role table 356 includes part or all of record 520 and record 530 as shown in FIG. 5, for example, note that node indicator 452, capacity indicator 552, module indicator 562, and version indicator 572 can all be alike in these two records. This can indicate that the "other" module (identified by module indicator 562, e.g.) has at least two roles. These flows can occur, for example, in an embodiment in which role table 356 performs operation 1130, and in which module evaluator 384 performs operation 1140.

Operation 2436 describes receiving the first code role indicator with the first code module (e.g. code 132 receiving as module 134 a pipe configuration routine with a role-indicative filename like "Pipe_config"). In some embodiments, the code role indicators can be sent ahead of or in lieu of the corresponding code. The code can be downloaded to the first node responsive to a task request identifying the code module, for example, provided there has been no superseding command by which a "second" code module is identified in lieu of the "first" code module. These flows can occur, for example, in an embodiment in which memory 130 performs operation 1130, and in which CPU 120 and module 135 jointly perform operation 1140.

Operation 2442 describes deciding that the first node accepts the second code module, responsive to the result indicating that the first code role indicator and the second code role indicator differ substantially (e.g. module manager 394 instructing network interface 380 to store a new operating system as module(s) 326, responsive to receiving an indication from comparator 388 that no other operating systems resident there are equivalent). This can be convenient, for example, if device 310 later encounters a need to use a module that can only be used with the new operating system. Alternatively or additionally, CPU 320 can later substitute the non-equivalent (stored) operating system in performing the above-described variants of operation 620, such as when provenance data suggests an incumbent operating system of system 300 may be problematic.

Operation 2443 describes requesting via a network interface the comparison between the first code role indicator and the second code role indicator; and (e.g. comparator 388 requesting via network interface 380 that network 350 or device 210 compare the code role indicator comparison). Requesting an external determination from such a central or other zonal resource for one or more of emulating, estimating, evaluating, and comparing can be advantageous, especially when the behavior of a module is unknown.

Operation 2444 describes receiving via the network interface the result of the comparison (e.g. portion 359 of role table 356 receiving a result unfavorable to the second code module). The result can include one or more user-comprehensible indications explaining a high or low result—"infected," "slow," or "bulky" for unfavorable results, for example, or "small," "accurate," or "trusted" for favorable results). One or more of operation 2443 or operation 2444 can be used in lieu of or as a supplement to one or more components of local module evaluator 384. In some embodiments, for example, comparator 388 estimates a "best effort" substitute result responsive to a time out or other failure of operation 2444 to provide the result.

Operation 2447 describes deciding whether to accept the second code module, responsive also to a result of a comparison between a performance indicator of the first code module and a performance indicator of the second code module (e.g. module evaluator 384 deciding whether to accept "Mod2" responsive to a comparison with "Mod1" that takes both role and performance comparisons, at least, into account). In some embodiments, the decision can be used for deciding whether or when to accept the second code module into a memory or storage. In some embodiments, the decision can be used for deciding whether or when to remove an unused or under-used module from a memory or storage. In some embodiments, the decision can likewise be used for deciding whether to include a listing of a role or module in a request, recommendation, or other access list. In some variants of these embodiments, one or more of the performance indicators can be received as user input (from user 51, e.g.). In some variants one or more of the performance indicators can be based upon process data components 244, 245 resulting from executing the "Mode1" and "Mod2" code modules, respectively. In some variants one or more of the performance indicators can be generated by executing the module(s) on emulator 385, which can be configured to resemble an operating environment of another node (such as device 110, e.g.)

Operation 2448 describes removing the association between the first code role indicator and the first code module while retaining an association between the first code module and a third code role indicator. (e.g. role table 356 replacing a value like module indicator 562 in record 520 while leaving a value like module indicator 562 in record 530). This can be advantageous, for example, for a disk drive maintenance module that still includes the best available defragmenter (as role indicator 443, e.g.) locally but also includes a diagnostic module (as role indicator 442) that has been superseded. These flows can occur, for example, in an embodiment in which role manager 391 performs operation 1130 employing logic implementing role table 500, and in which CPU 120 and module 135 jointly perform operation 1140.

Figure 25:
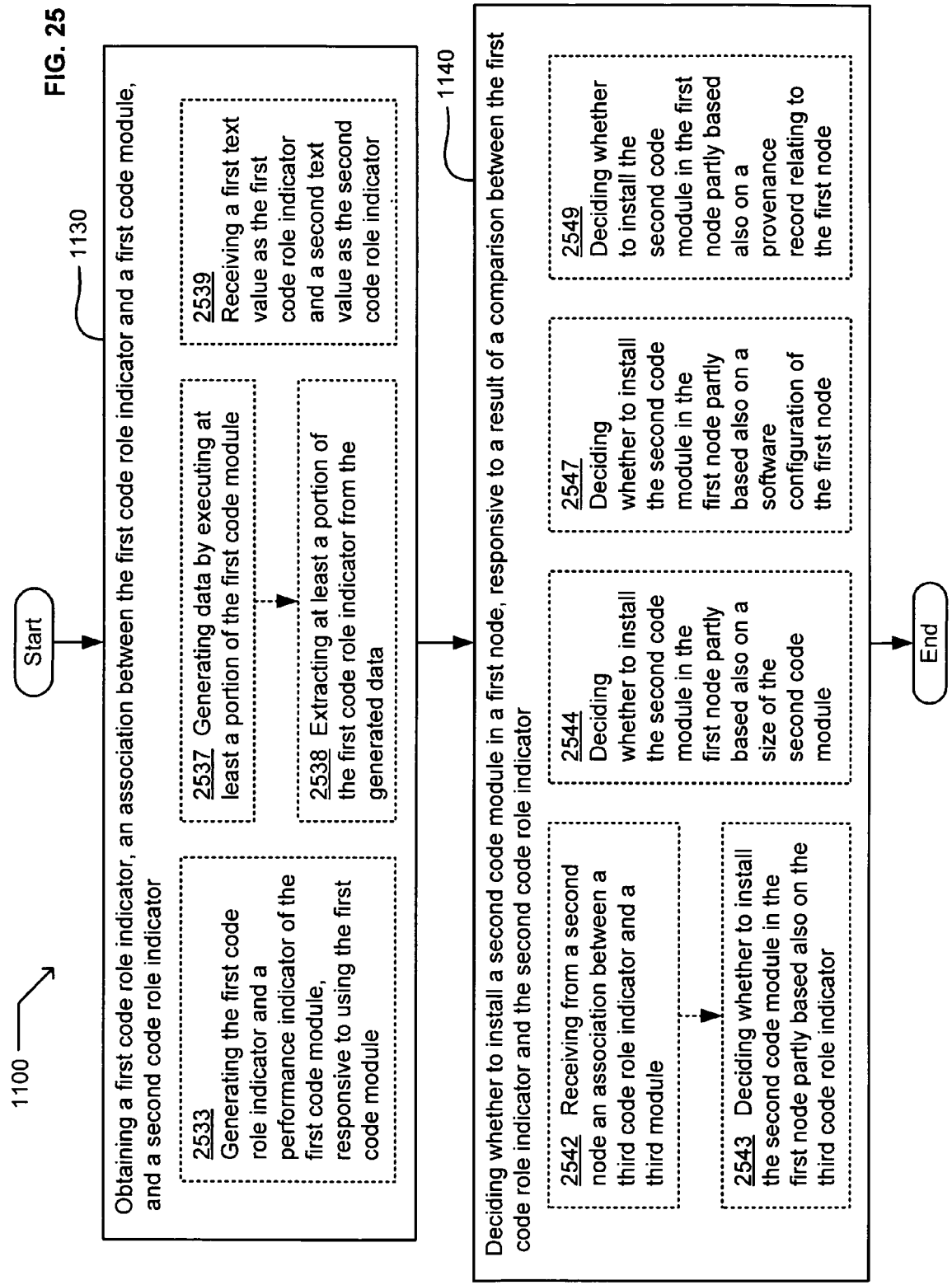

Referring now to FIG. 25 there are shown several variants of the flow 1100 of FIG. 11, 23, or 24. Operation 1130—obtaining a first code role indicator, an association between the first code role indicator and a first code module, and a second code role indicator—may include one or more of the following operations: 2533, 2537, 2538, or 2539. Operation 1140—deciding whether to install a second code module in a first node, responsive to a result of a comparison between the first code role indicator and the second code role indicator—may include one or more of the following operations: 2542, 2543, 2544, 2547, or 2549.

Operation 2533 describes generating the first code role indicator and a performance indicator of the first code module, responsive to using the first code module. (e.g. emulator 385 and performance evaluator 386 jointly testing "Mod1" and generating a performance indicator of "fast" and a code role indicator of block 378, as a sample program output). Such sample program output can be used for comparison with parameters of policy 395, for example, or with an analogous output from a known good program. In some embodiments, a portion of the sample program output can be tested for an apparent thematic relation as exemplified above concerning operation 2344. In some embodiments, CPU 320 and a portion of module 335 can be used directly for testing module 335 in live operation. These flows can occur, for example, in an embodiment in which code 332 and role table 356 jointly perform operation 1130.

Operation 2537 describes generating data by executing at least a portion of the first code module (e.g. CPU 320 and portions of resource management circuitry 390 jointly executing module 335 for 10 seconds and capturing resulting state information, output, or other data in cache 376).

Operation 2538 describes extracting at least a portion of the first code role indicator from the generated data (e.g. performance evaluator 386 concatenating the above-referenced resulting data in cache 376 into a message sent to device 110, as the "first" node). These flows can occur, for example, in an embodiment in which CPU 120 and module 134 jointly perform operation 1130, such as by remotely requesting evaluations or the comparison from module evaluator 384. Alternatively or additionally, CPU 120 and module 135 can jointly perform operation 1140, such as by analyzing the responsive signal 115 returned later.

Operation 2539 describes receiving a first text value as the first code role indicator and a second text value as the second code role indicator (e.g. role manager 391 holding "OnEvent" and "Oncheck" in a first portion 358 of role table 356). These text values can likewise comprise Internet Protocol addresses or other handles, for example, for use in performing operation 1140 by CPU 320 or portions of resource management circuitry 390 as described above.

Operation 2542 describes receiving from a second node an association between a third code role indicator and a third module (e.g. event log 127 accumulating advertisements about "svchost" on device 210 and about "svhost" on device 310).

Operation 2543 describes deciding whether to install the second code module in the first node partly based also on the third code role indicator (e.g. CPU 120 performing a periodic or responsive maintenance routine by which "svchost" and "svhost" can be evaluated against each other and one or more incumbent modules 134). One or more of these evaluations can cause CPU 120 to compete operation 1140, deciding whether to install the module for "svchost."

Operation 2544 describes deciding whether to install the second code module in the first node partly based also on a size of the second code module (e.g. module manager 394 using "5 Megabytes" in deciding whether to install a foreign module of that size). In some embodiments, the decision of operation 1140 also partly based one or more additional factors, such as those described next.

Operation 2547 describes deciding whether to install the second code module in the first node partly based also on a software configuration of the first node (e.g. module manager 394 applying policy 395 to an incumbent operating system on the target device, in deciding whether to install a foreign module). In some embodiments, the second code module defines a list or attribute of compatible operating systems which can be recognized and used by policy 395.

Operation 2549 describes deciding whether to install the second code module in the first node partly based also on a provenance record relating to the first node (e.g. CPU 120 and module 135 jointly deciding responsive to portion 165 of provenance record 162). In some embodiments, the provenance record can include a state or event indication contraindicative of the second code module. For a node having a recent provenance record indicating a high CPU usage or frequent time-out errors, for example, the second code module having only a computation-intensive role bears strongly toward a negative decision.

Figure 26:
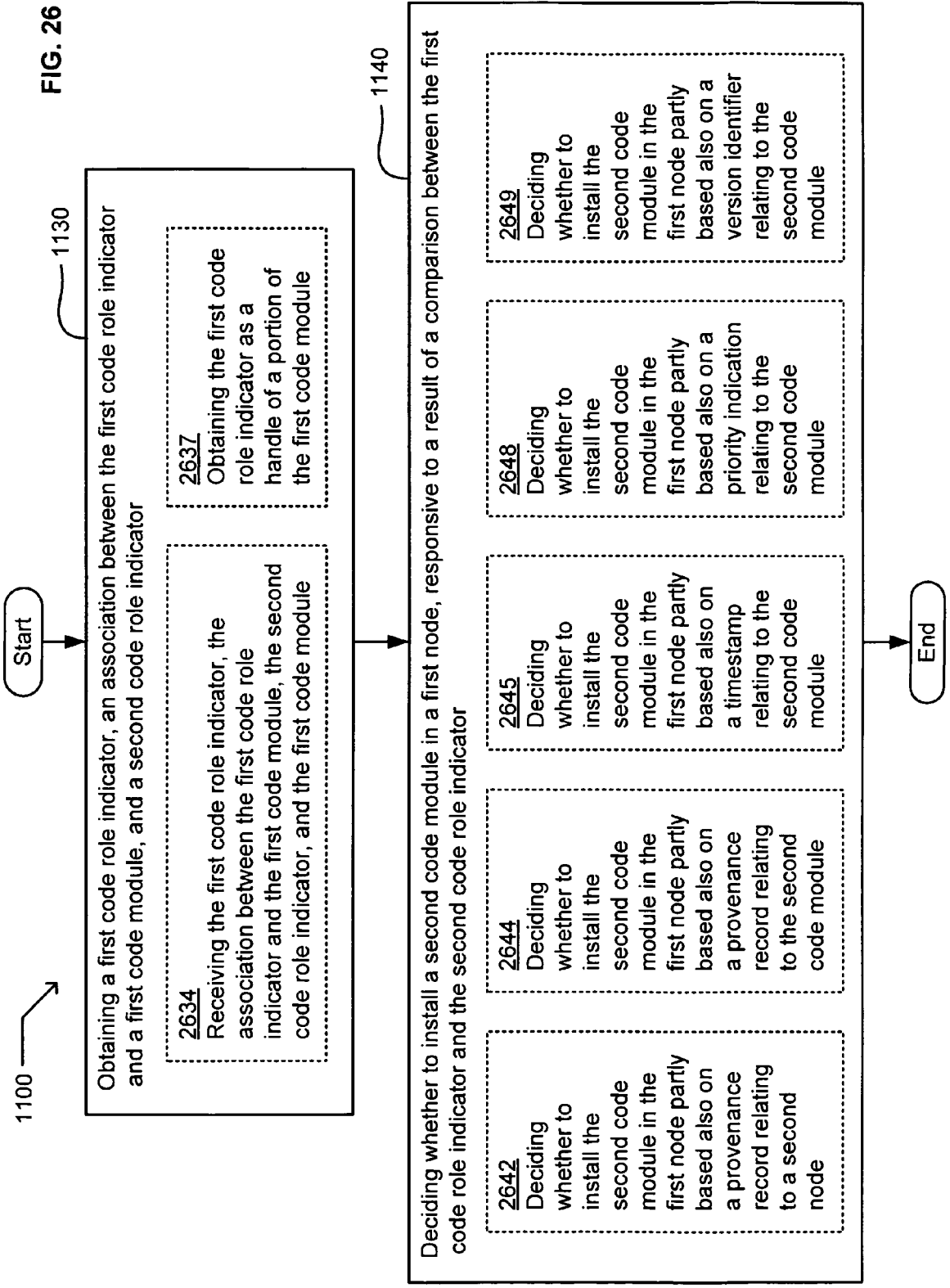

Referring now to FIG. 26 there are shown several variants of the flow 1100 of FIG. 11, 23, 24, or 25. Operation 1130—obtaining a first code role indicator, an association between the first code role indicator and a first code module, and a second code role indicator—may include one or more of the following operations: 2634 or 2637. Operation 1140—deciding whether to install a second code module in a first node, responsive to a result of a comparison between the first code role indicator and the second code role indicator—may include one or more of the following operations: 2642, 2644, 2645, 2648, or 2649.

Operation 2634 describes receiving the first code role indicator, the association between the first code role indicator and the first code module, the second code role indicator, and the first code module (e.g. network interface 380 receiving these items via network 350 and passing them to memory 330 comprising code 332 and role table 356). These flows can occur, for example, in an embodiment in which code 332 and role table 356 jointly perform operation 1130, and in which CPU 320 and previously-received module 335 jointly perform operation 1140. On an affirmative decision, for example, the just-arrived first code module 334 can be installed on device 310.

Operation 2637 describes obtaining the first code role indicator as a handle of a portion of the first code module (e.g. role table 356 receiving "opt_out" as a descriptive name of an externally-accessible subroutine within the first code module). In some embodiments, the handle instead comprises a pointer to the portion.

Operation 2642 describes deciding whether to install the second code module in the first node partly based also on a provenance record relating to a second node (e.g. module manager 394 using portion 265 of provenance record 262 in deciding whether to install a foreign module onto device 310).

Operation 2644 describes deciding whether to install the second code module in the first node partly based also on a provenance record relating to the second code module. (e.g. module manager 394 using portion 265 of provenance record 262 in deciding whether to install a foreign module onto device 310).

Operation 2645 describes deciding whether to install the second code module in the first node partly based also on a timestamp relating to the second code module (e.g. module manager 394 using "11:37:08 AM" as a portion 165 of a provenance of module 235 or even of module 335). These flows can occur, for example, in an embodiment in which code 332 and role table 356 jointly perform operation 1130, and in which CPU 320 and previously-received module 334 jointly perform operation 1140.

Operation 2648 describes deciding whether to install the second code module in the first node partly based also on a priority indication relating to the second code module (e.g. module manager 394 using a high-priority indicator to reach an affirmative decision in at least some situation in which a lower-priority indicator would yield a decision not to install). The word "medium" can serve as the high-priority indicator, for example, relative to the word "low."

Operation 2649 describes deciding whether to install the second code module in the first node partly based also on a version identifier relating to the second code module (e.g. module manager 394 deciding to install a Vista operating system, as the second code module, only because the version indicator 571 is higher than 1.0). In some embodiments, the decision of operation 1140 also partly based one or more additional factors, such as those described above.

Those having skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

While particular aspects of the present subject matter described herein have been shown and described, it will be apparent to those skilled in the art that, based upon the teachings herein, changes and modifications may be made without departing from this subject matter described herein and its broader aspects and, therefore, the appended claims are to encompass within their scope all such changes and modifications as are within the true spirit and scope of this subject matter described herein.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Moreover, "can" and "optionally" and other permissive terms are used herein for describing optional features of various embodiments. These terms likewise describe selectable or configurable features generally, unless the context dictates otherwise.

The herein described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality. Any two components capable of being so associated can also be viewed as being "operably couplable" to each other to achieve the desired functionality. Specific examples of operably couplable include but are not limited to physically mateable and/or physically interacting components and/or wirelessly.

What is claimed is:

1. A method of determining provenance data to be transmitted from a first node to a second node at least partially in response to an operational status of the second node, the method at least partially implemented using hardware, the method comprising:
   receiving, at a first node, data from a second node;
   determining, at the first node, at least partially from the received data, an operational status indicative of at least one of a bandwidth limit or a failure indication of the second node;
   generating, at the first node, one or more index values based at least partially on at least one of the operational status, the bandwidth limit, or the failure indication, the one or more index values corresponding to one or more possible provenance inclusion modes determinable from at least one of a failure data base of one or more similar cases or a suggestion database of one or more similar cases;
   determining, at the first node, a provenance inclusion mode based at least partially on the one or more index values and the at least one of the failure data base of one or more similar cases or the suggestion database of one or more similar cases, the provenance inclusion mode at least partially determining at least one characteristic of provenance data to be transmitted from the first node to the second node, the at least one characteristic of provenance data being at least partially dependent upon at least one of the operational status, the bandwidth limit, or the failure indication; and
   determining, at the first node, provenance data for transmittal from the first node to the second node based at least partially on the determined provenance inclusion mode.

2. The method of claim 1, further comprising:
   receiving one or more mode control parameters; and
   updating the provenance inclusion mode based at least partially on the one or more control parameters.

3. The method of claim 1, further comprising:
   determining one or more mode control parameters partly based on an error indication and partly based on a capacity; and
   updating the provenance inclusion mode based at least partially on the one or more control parameters.

4. A method of determining provenance data to be transmitted from a first node to a second node at least partially in response to an operational status of the second node, the method at least partially implemented using hardware, the method comprising:
   receiving, at a first node, data from a second node, the data including at least a handle relating to a first software program active on the second node;

determining, at the first node, at least partially from the received data, an operational status indicative of at least one of a bandwidth limit or a failure indication of the second node;

generating, at the first node, one or more index values based at least partially on at least one of the operational status, the bandwidth limit, the failure indication, or the handle, the one or more index values corresponding to one or more possible provenance inclusion modes determinable from at least one of a failure data base of one or more similar cases or a suggestion database of one or more similar cases;

determining, at the first node, a provenance inclusion mode based at least partially on the one or more index values and the at least one of the failure data base of one or more similar cases or the suggestion database of one or more similar cases, the provenance inclusion mode at least partially determining at least one characteristic of provenance data to be transmitted from the first node to the second node, the at least one characteristic of provenance data being at least partially dependent upon at least one of the operational status, the bandwidth limit, the failure indication, or the handle; and determining, at the first node, provenance data for transmittal from the first node to the second node based at least partially on the determined provenance inclusion mode.

5. The method of claim 4, further comprising:
transmitting an indication of an event and information pertinent to the operational status of the second node to another subsystem; and
receiving, at the first node, an evaluation of the event responsive to the information pertinent to the operational status state of the second node from the other subsystem.

6. The method of claim 4, further comprising:
relating, in the first node, an event with an event in a third node; and
generating an evaluation responsive to one or more attributes of the third node.

7. The method of claim 4, wherein receiving, at a first node, data from a second node including at least a handle relating to a first software program active on the second node comprises:
obtaining an indication of an event in a first node roughly contemporaneously with obtaining information pertinent to a state of a second node.

8. The method of claim 7, wherein obtaining an indication of an event in a first node roughly contemporaneously with obtaining information pertinent to a state of a second node comprises:
obtaining the indication of the event in the first node within about one day of obtaining the information pertinent to the state of the second node.

9. A system for determining provenance data to be transmitted from a first node to a second node at least partially in response to an operational status of the second node, the system at least partially implemented using hardware, the system comprising:
means for receiving, at a first node, data from a second node;
means for determining, at the first node, at least partially from the received data, an operational status indicative of at least one of a bandwidth limit or a failure indication of the second node;
means for generating, at the first node, one or more index values based at least partially on at least one of the operational status, the bandwidth limit, or the failure indication, the one or more index values corresponding to one or more possible provenance inclusion modes determinable from at least one of a failure data base of one or more similar cases or a suggestion database of one or more similar cases;
means for determining, at the first node, a provenance inclusion mode based at least partially on the one or more index values and the at least one of the failure data base of one or more similar cases or the suggestion database of one or more similar cases, the provenance inclusion mode at least partially determining at least one characteristic of provenance data to be transmitted from the first node to the second node, the at least one characteristic of provenance data being at least partially dependent upon at least one of the operational status, the bandwidth limit, or the failure indication; and
means for determining, at the first node, provenance data for transmittal from the first node to the second node based at least partially on the determined provenance inclusion mode.

10. The system of claim 9, further comprising:
means for updating the provenance inclusion mode responsive to one or more mode control parameters.

11. The system of claim 9, wherein the means for determining, at the first node, provenance data for transmittal from the first node to the second node based at least partially on the determined provenance inclusion mode comprises:
means for determining, at the first node, one or more instructions for transmittal from the first node to the second node.

12. A system for determining provenance data to be transmitted from a first node to a second node at least partially in response to an operational status of the second node, the system at least partially implemented using hardware, the system comprising:
means for receiving, at a first node, data from a second node, the data including at least a handle relating to a first software program active on the second node;
means for determining, at the first node, at least partially from the received data, an operational status indicative of at least one of a bandwidth limit or a failure indication of the second node;
means for generating, at the first node, one or more index values based at least partially on at least one of the operational status, the bandwidth limit, the failure indication, or the handle, the one or more index values corresponding to one or more possible provenance inclusion modes determinable from at least one of a failure data base of one or more similar cases or a suggestion database of one or more similar cases;
means for determining, at the first node, a provenance inclusion mode based at least partially on the one or more index values and the at least one of the failure data base of one or more similar cases or the suggestion database of one or more similar cases, the provenance inclusion mode at least partially determining at least one characteristic of provenance data to be transmitted from the first node to the second node, the at least one characteristic of provenance data being at least partially dependent upon at least one of the operational status, the bandwidth limit, the failure indication, or the handle; and
means for determining, at the first node, provenance data for transmittal from the first node to the second node based at least partially on the determined provenance inclusion mode.

13. The system of claim 12, further comprising:
means for transmitting an evaluation of an event in the first node responsive to information pertinent to the operational status of the second node.

14. The system of claim 13, wherein the means for transmitting an evaluation of an event in the first node responsive to information pertinent to the operational status of the second node comprises:
means for transmitting the evaluation of the event in the first node responsive to a request.

15. A system for determining provenance data to be transmitted from a first node to a second node at least partially in response to an operational status of the second node, the system at least partially implemented using hardware, the system comprising:
circuitry for receiving, at a first node, data from a second node;
circuitry for determining, at the first node, at least partially from the received data, an operational status indicative of at least one of a bandwidth limit or a failure indication of the second node;
circuitry for generating, at the first node, one or more index values based at least partially on at least one of the operational status, the bandwidth limit, or the failure indication, the one or more index values corresponding to one or more possible provenance inclusion modes determinable from at least one of a failure data base of one or more similar cases or a suggestion database of one or more similar cases;
circuitry for determining, at the first node, a provenance inclusion mode based at least partially on the one or more index values and the at least one of the failure data base of one or more similar cases or the suggestion database of one or more similar cases, the provenance inclusion mode at least partially determining at least one characteristic of provenance data to be transmitted from the first node to the second node, the at least one characteristic of provenance data being at least partially dependent upon at least one of the operational status, the bandwidth limit, or the failure indication; and
circuitry for determining, at the first node, provenance data for transmittal from the first node to the second node based at least partially on the determined provenance inclusion mode.

16. The system of claim 15, further comprising:
circuitry for updating the provenance inclusion mode responsive to one or more mode control parameters.

17. The system of claim 15, wherein the circuitry for determining, at the first node, provenance data for transmittal from the first node to the second node based at least partially on the determined provenance inclusion mode comprises:
circuitry for determining whether to include a component in provenance data responsive to the determined provenance inclusion mode.

18. A system for determining provenance data to be transmitted from a first node to a second node at least partially in response to an operational status of the second node, the system at least partially implemented using hardware, the system comprising:
circuitry for receiving, at a first node, data from a second node, the data including at least a handle relating to a first software program active on the second node;
circuitry for determining, at the first node, at least partially from the received data, an operational status indicative of at least one of a bandwidth limit or a failure indication of the second node;
circuitry for generating, at the first node, one or more index values based at least partially on at least one of the operational status, the bandwidth limit, the failure indication, or the handle, the one or more index values corresponding to one or more possible provenance inclusion modes determinable from at least one of a failure data base of one or more similar cases or a suggestion database of one or more similar cases;
circuitry for determining, at the first node, a provenance inclusion mode based at least partially on the one or more index values and the at least one of the failure data base of one or more similar cases or the suggestion database of one or more similar cases, the provenance inclusion mode at least partially determining at least one characteristic of provenance data to be transmitted from the first node to the second node, the at least one characteristic of provenance data being at least partially dependent upon at least one of the operational status, the bandwidth limit, the failure indication, or the handle; and
circuitry for determining, at the first node, provenance data for transmittal from the first node to the second node based at least partially on the determined provenance inclusion mode.

19. The system of claim 18, further comprising:
circuitry for obtaining an indication of an event in the first node roughly contemporaneously with obtaining information pertinent to a state of the second node.

20. The system of claim 19, wherein the circuitry for obtaining an indication of an event in a first node roughly contemporaneously with obtaining information pertinent to a state of a second node comprises:
circuitry for transmitting a status request to the second node.

21. The system of claim 19, wherein the circuitry for obtaining an indication of an event in a first node roughly contemporaneously with obtaining information pertinent to a state of a second node comprises:
circuitry for obtaining an indication of one or more register states as the indication of the event in the first node.

22. The system of claim 19, wherein the circuitry for obtaining an indication of an event in a first node roughly contemporaneously with obtaining information pertinent to a state of a second node comprises:
circuitry for obtaining one or more register states as the information pertinent to the state of the second node.

23. The system of claim 19, wherein the circuitry for obtaining an indication of an event in a first node roughly contemporaneously with obtaining information pertinent to a state of a second node comprises:
circuitry for receiving an indication of a process completion as the event in the first node.

24. The system of claim 19, wherein the circuitry for obtaining an indication of an event in a first node roughly contemporaneously with obtaining information pertinent to a state of a second node comprises:
circuitry for receiving an error signal as the indication of the event in the first node.

25. The system of claim 19, wherein the circuitry for obtaining an indication of an event in a first node roughly contemporaneously with obtaining information pertinent to a state of a second node comprises:
circuitry for receiving an indication of one or more instructions as the information pertinent to the state of the second node.

26. The system of claim 19, wherein the circuitry for obtaining an indication of an event in a first node roughly contemporaneously with obtaining information pertinent to a state of a second node comprises:
  circuitry for transferring one or more instructions between the first node and the second node.

27. The system of claim 19, wherein the circuitry for obtaining an indication of an event in a first node roughly contemporaneously with obtaining information pertinent to a state of a second node comprises:
  circuitry for receiving an indication of a process completion or an error signal as the event in the first node;
  circuitry for obtaining an indication of one or more register states as the indication of the event in the first node;
  circuitry for transmitting a status request to the second node;
  circuitry for receiving, as some of the information pertinent to the state of the second subsystem, a handle pointing to an indicator of the state of the second node;
  circuitry for obtaining one or more register states as the information pertinent to the state of the second node; and
  circuitry for receiving an indication of one or more instructions pertinent to the state of the second node.

28. The system of claim 18, further comprising:
  circuitry for transmitting an evaluation of an event in the first node responsive to information pertinent to a state of the second node.

29. The system of claim 28, wherein the circuitry for transmitting an evaluation of an event in the first node responsive to information pertinent to a state of the second node comprises:
  circuitry for presenting the information pertinent to the state of the second node; and
  circuitry for receiving a user input as the evaluation.

30. The system of claim 28, wherein the circuitry for transmitting an evaluation of an event in the first node responsive to the information pertinent to a state of the second node comprises:
  circuitry for evaluating the event using an indication of the state of the second node.

31. The system of claim 28, wherein the circuitry for transmitting an evaluation of an event in the first node responsive to information pertinent to a state of the second node comprises:
  circuitry for finding at least a portion of the evaluation using the information pertinent to the state of the second node.

32. The system of claim 28, wherein the circuitry for transmitting an evaluation of an event in the first node responsive to information pertinent to a state of the second node comprises:
  circuitry for transmitting to the first subsystem the evaluation of the event in the first node.

33. The system of claim 28, wherein the circuitry for transmitting an evaluation of an event in the first node responsive to information pertinent to a state of the second node comprises:
  circuitry for generating one or more hypotheses as the evaluation of the event in the first node.

34. The system of claim 28, wherein the circuitry for transmitting an evaluation of an event in the first node responsive to information pertinent to a state of the second node comprises:
  circuitry for generating one or more instructions as the evaluation of the event in the first node.

35. The system of claim 28, wherein the circuitry for transmitting an evaluation of an event in the first node responsive to information pertinent to a state of the second node comprises:
  circuitry for obtaining the evaluation of the event in the first node, as an evaluation of at least the indication of the event in the first node.

36. The system of claim 28, wherein the circuitry for transmitting an evaluation of an event in the first node responsive to information pertinent to a state of the second node comprises:
  circuitry for determining whether to evaluate the event in the first node responsive to a received inclusion mode.

37. The system of claim 28, wherein the circuitry for transmitting an evaluation of an event in the first node responsive to information pertinent to a state of the second node comprises:
  circuitry for transmitting the evaluation of the event in the first node from the second node.

38. The system of claim 28, wherein the circuitry for transmitting an evaluation of an event in the first node responsive to information pertinent to a state of the second node comprises:
  circuitry for determining whether to evaluate the event in the first node responsive to a received inclusion mode;
  circuitry for including one or more of an hypothesis or an instruction in the evaluation of the event in the first node;
  circuitry for presenting the information pertinent to the state of the second node;
  circuitry for receiving a user input as some of the evaluation;
  circuitry for evaluating, in the first node, the event using an indication of the state of the second node; and
  circuitry for transmitting to the first node the evaluation of the event in the first node.

* * * * *